United States Patent [19]

Lowrey et al.

[11] Patent Number: 5,013,680
[45] Date of Patent: May 7, 1991

[54] PROCESS FOR FABRICATING A DRAM ARRAY HAVING FEATURE WIDTHS THAT TRANSCEND THE RESOLUTION LIMIT OF AVAILABLE PHOTOLITHOGRAPHY

[75] Inventors: Tyler A. Lowrey; Randal W. Chance; D. Mark Durcan; Ruojia Lee; Charles H. Dennison; Yauh-Ching Liu; Pierre C. Fazan; Fernando Gonzalez; Gordon A. Haller, all of Boise, Id.

[73] Assignee: Micron Technology, Inc., Boise, Id.

[21] Appl. No.: 555,980

[22] Filed: Jul. 18, 1990

[51] Int. Cl.$^5$ ............................................ H01L 21/70
[52] U.S. Cl. ...................................... 437/52; 437/38; 437/47; 437/51; 437/191; 437/192; 437/200; 437/228; 437/233; 437/235; 437/919
[58] Field of Search ....................... 437/38, 47, 51, 52, 437/60, 191, 193, 195, 228, 233, 235, 192, 200, 931, 919, 948, 962; 357/236, 51; 365/174

[56] References Cited

U.S. PATENT DOCUMENTS

| | | | |
|---|---|---|---|
| 4,359,816 | 11/1982 | Abbas et al. | 437/228 |
| 4,464,212 | 8/1984 | Bhatia et al. | 357/51 |
| 4,650,544 | 3/1987 | Erb et al. | 437/228 |
| 4,758,528 | 7/1988 | Goth et al. | 437/228 |
| 4,859,622 | 8/1989 | Eguchi | 437/228 |
| 4,920,065 | 4/1990 | Chin et al. | 437/228 |

OTHER PUBLICATIONS

Nicky C. C. Lu, "Advanced Cell Structures for Dynamic RAMS", IEEE Circuits and Devices Magazine, Jan. 1989, pp. 27–36.

Primary Examiner—Brian E. Hearn
Assistant Examiner—Tom Thomas
Attorney, Agent, or Firm—Angus C. Fox, III; Stanley N. Protigal

[57] ABSTRACT

A process for creating a DRAM array having feature widths that transcend the resolution limit of the employed photolithographic process using only five photomasking steps. The process involves the following steps: creation of a half-pitch hard-material mask that is used to etch a series of equidistanty-spaced isolation trenches in a silicon substrate; filling the isolation trenches with insulative material; creation of a hard-material mask consisting of strips that are 1-$\frac{1}{2}$F in width, separated by spaces that are $\frac{1}{2}$F in width, that is used to etch a matrix of storage trenches; angled implantation of a N-type impurity in the storage trench walls; another anisotropic etch to deepen the storage trenches; deposition of a capacitor dielectric layer; deposition of a protective polysilicon layer on top of the dielectric layer; removal of the dielectric layer and the protective polysilicon layer at the bottom of each storage trench with a further anisotropic etch; filling the storage trenches with in-situ-doped polysilicon; planarization down to the substrate level; creation of an access gate on opposite sides of each storage trench, in addition to wordlines which interconnect gates within array columns by anisotropically etching a conformal conductive layer that has been deposited on top of oxide-silicon mesas that run perpendicular to the isolation trenches and are centered between the rows of storage trenches, the oxide-silicon mesas having been created with an etch using a photoresist mask consisting of a series of parallel strips that have been laid down with minimum feature and space width, then plasma etched to $\frac{3}{4}$F; creation of source and drains with an N-type implant; and anisotropically etching the metal layer to create bitlines along the sidewalls of the oxide mesas.

21 Claims, 48 Drawing Sheets

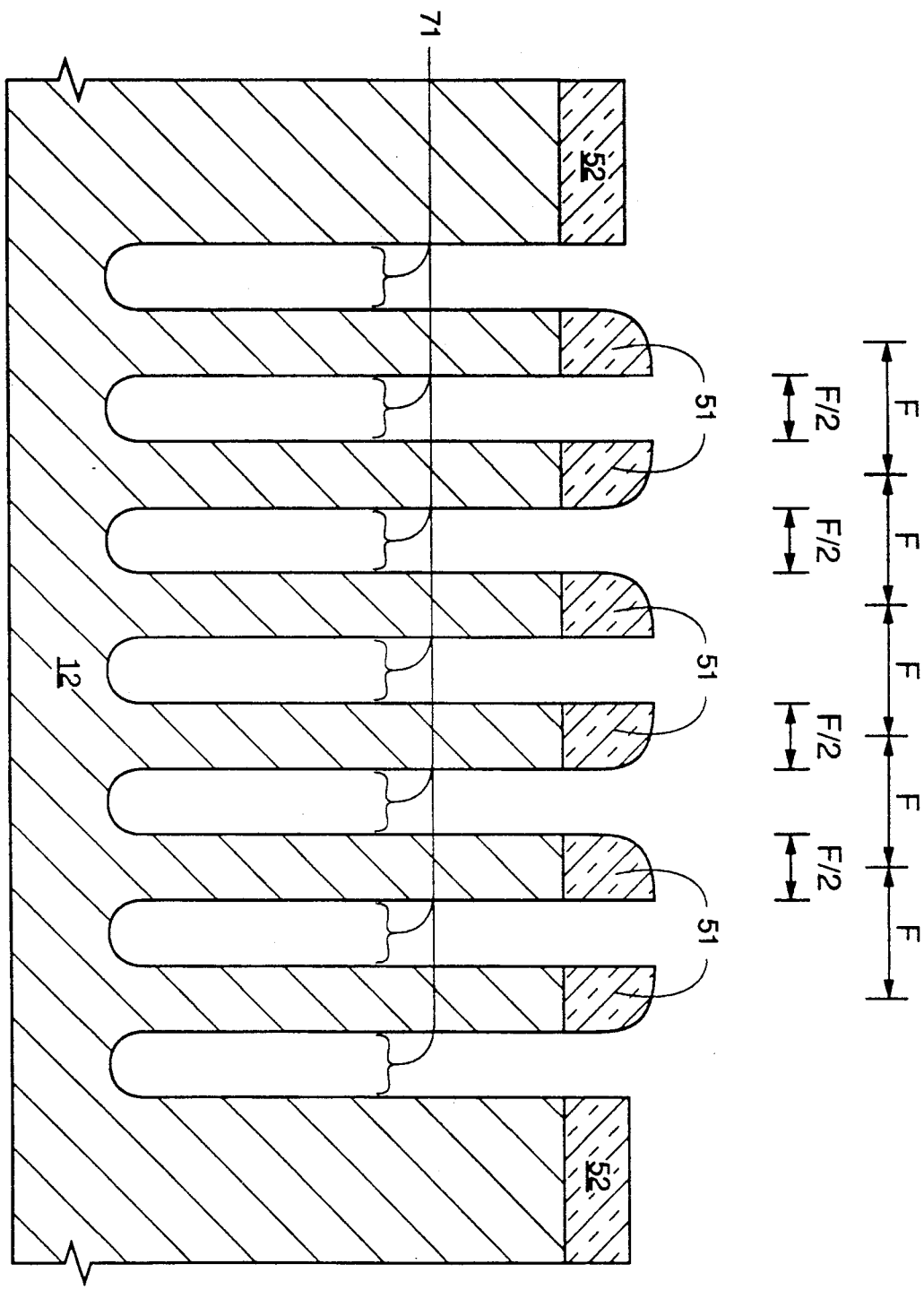

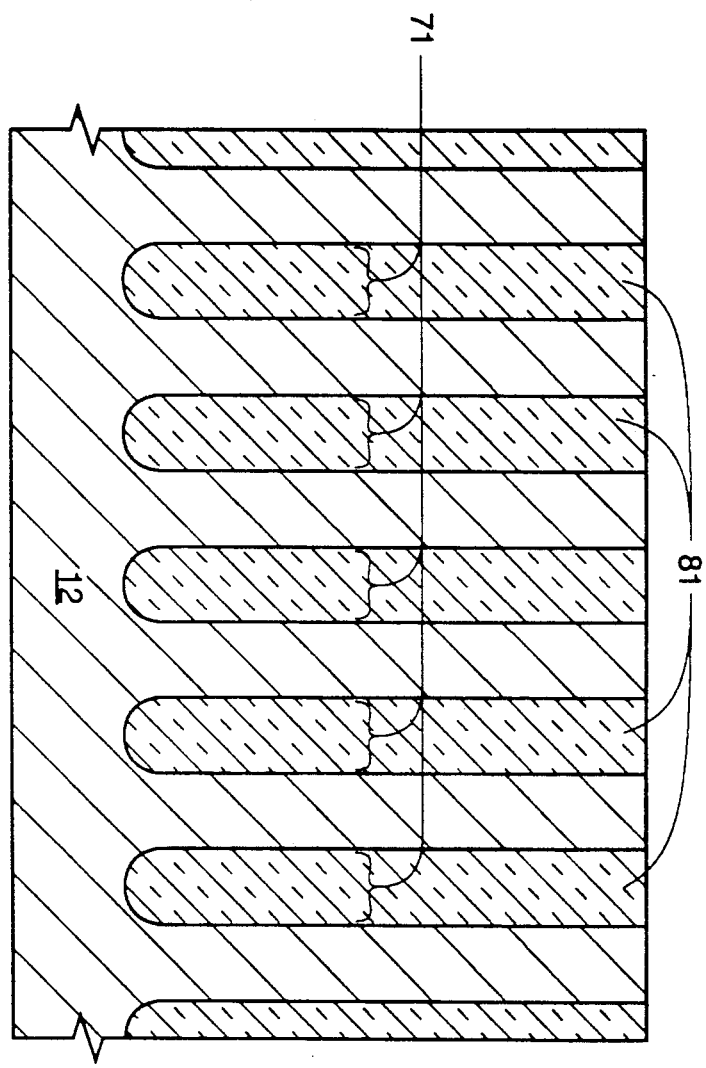

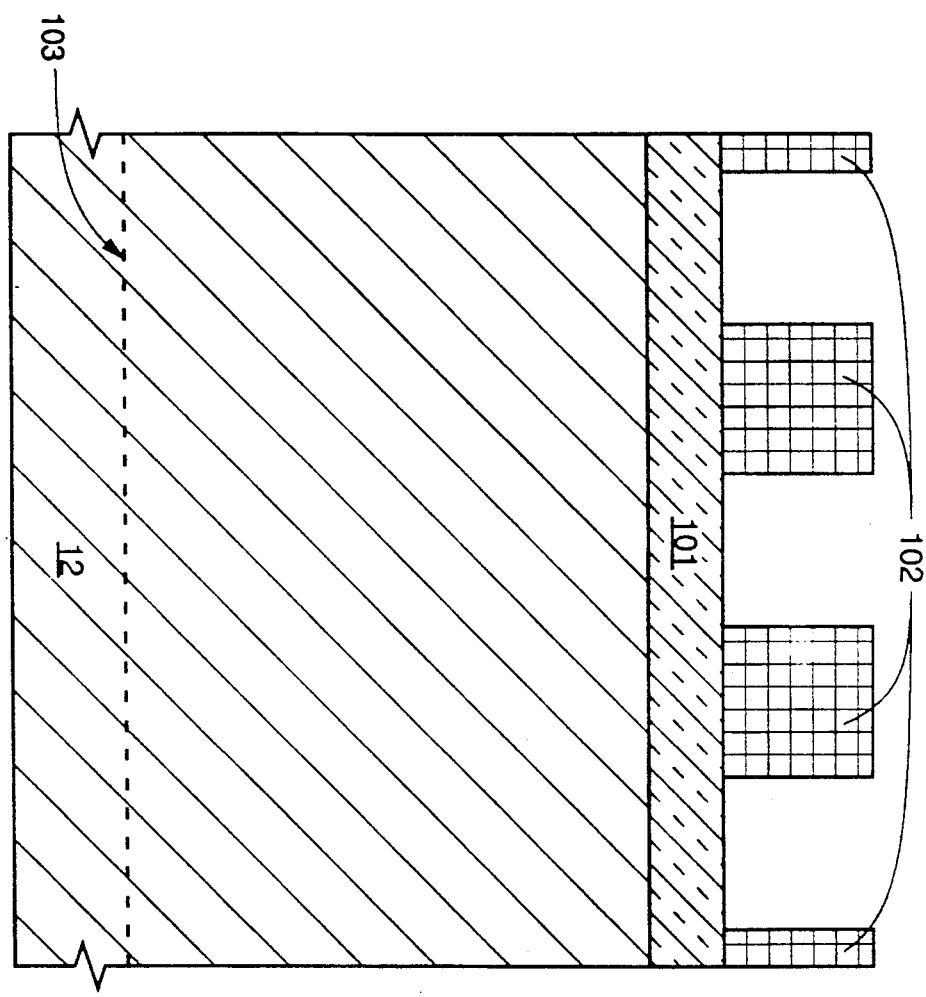

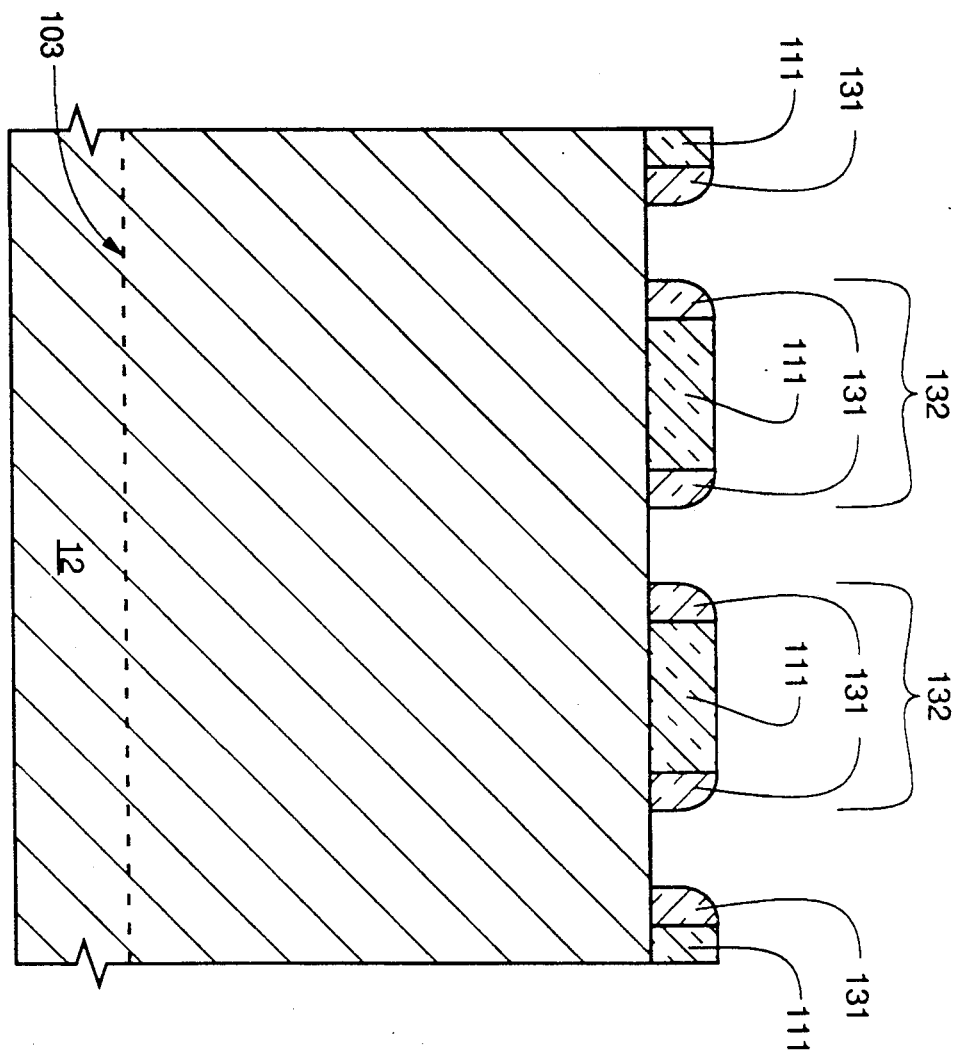

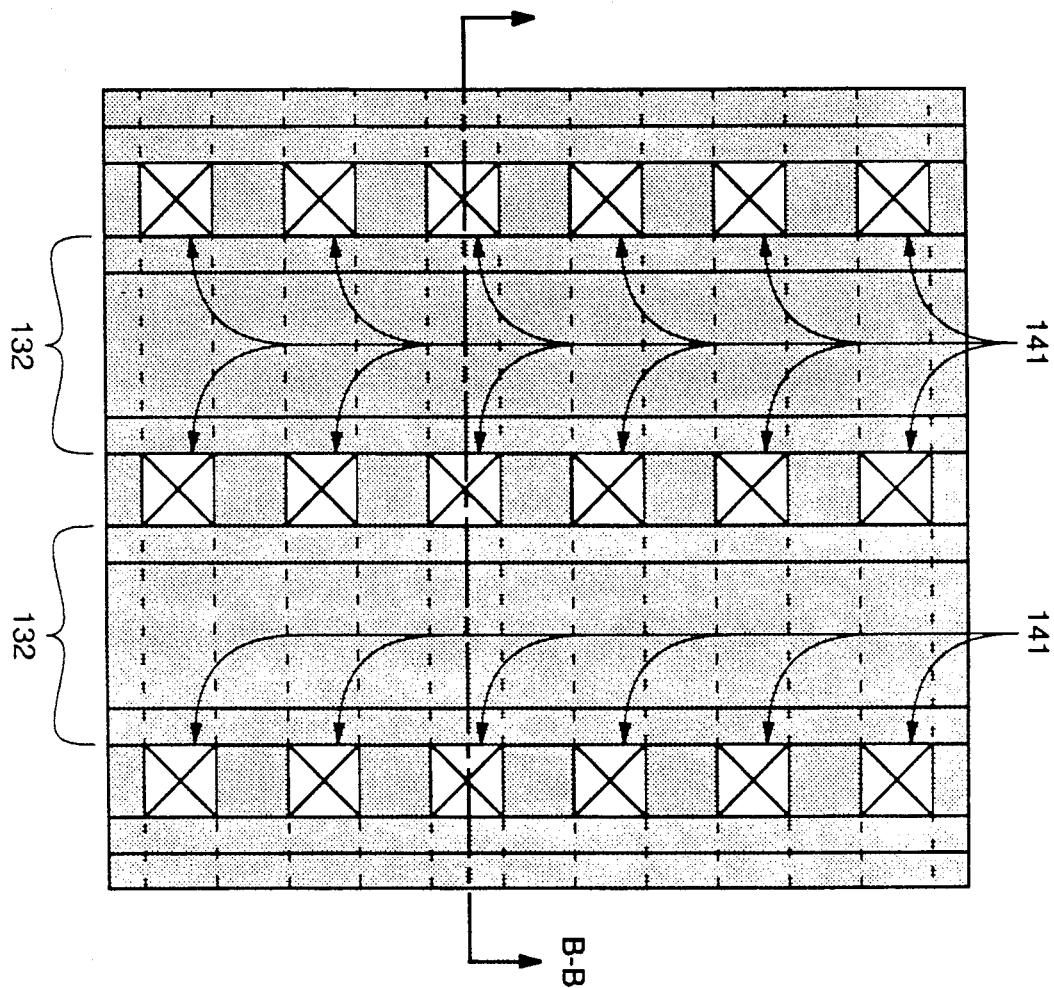

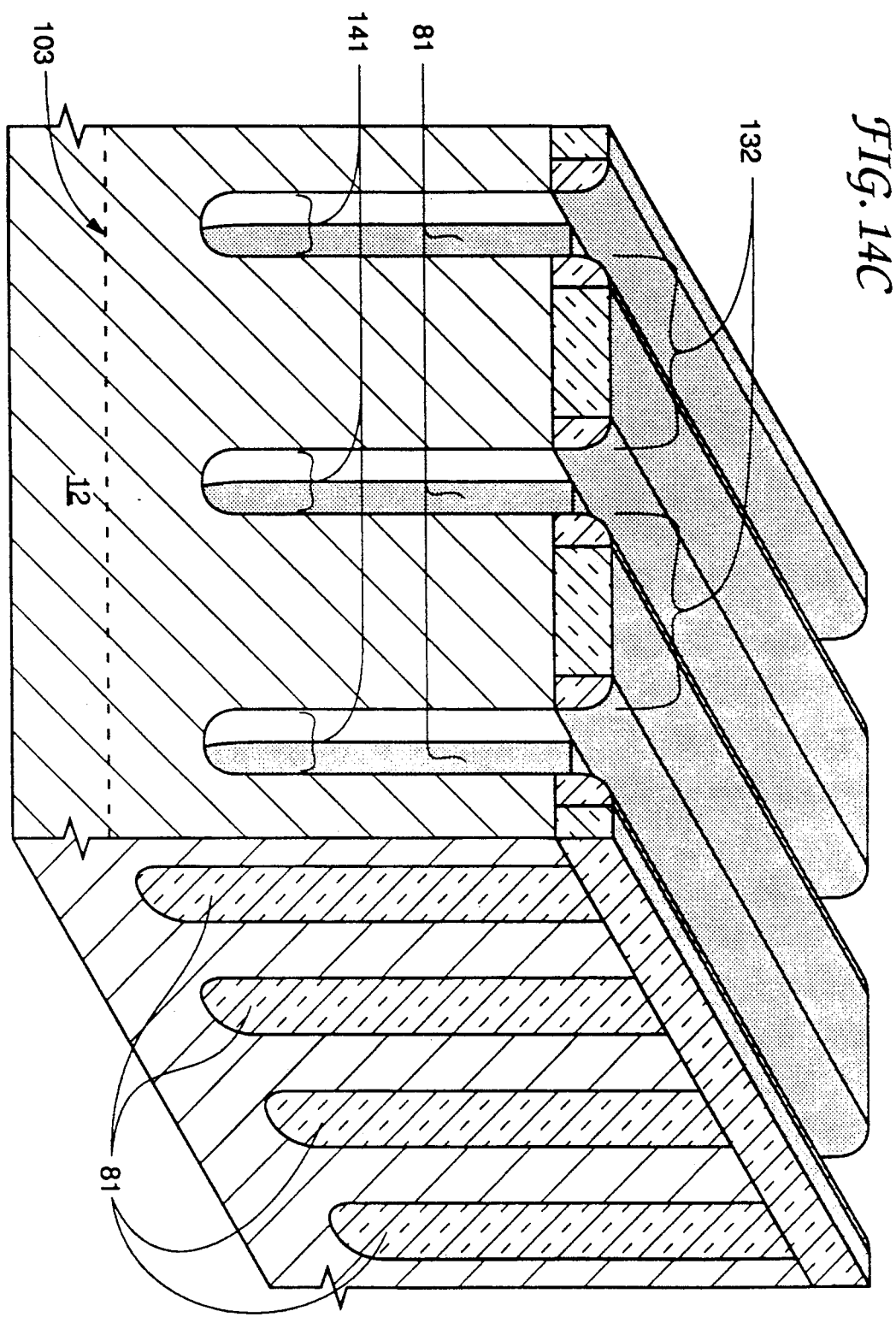

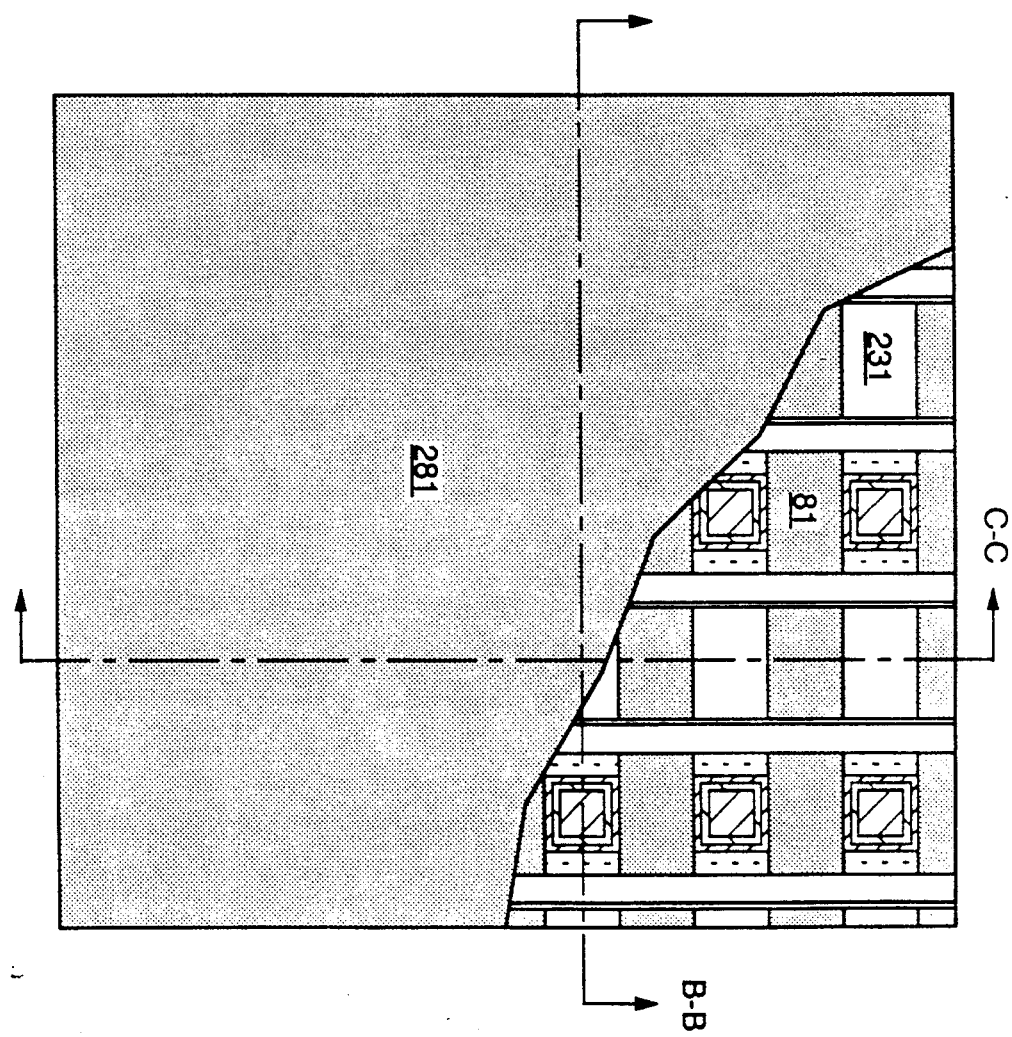

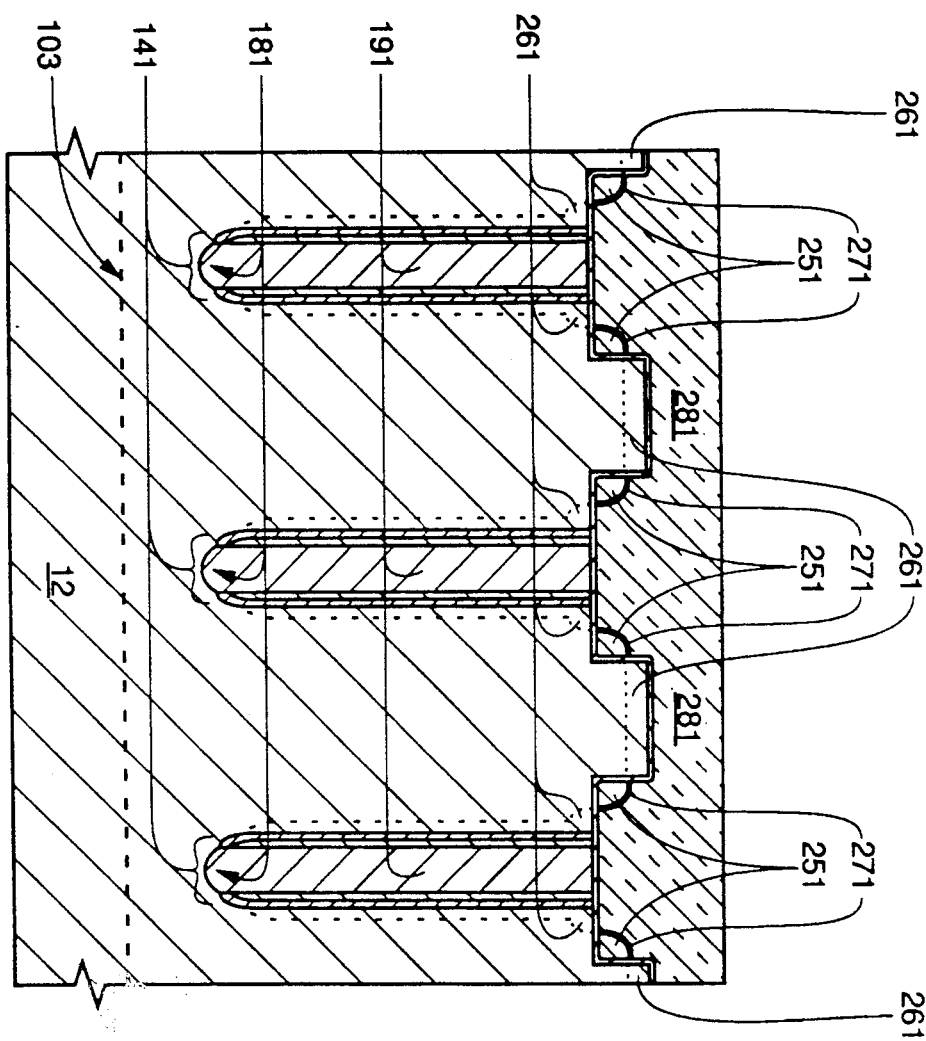

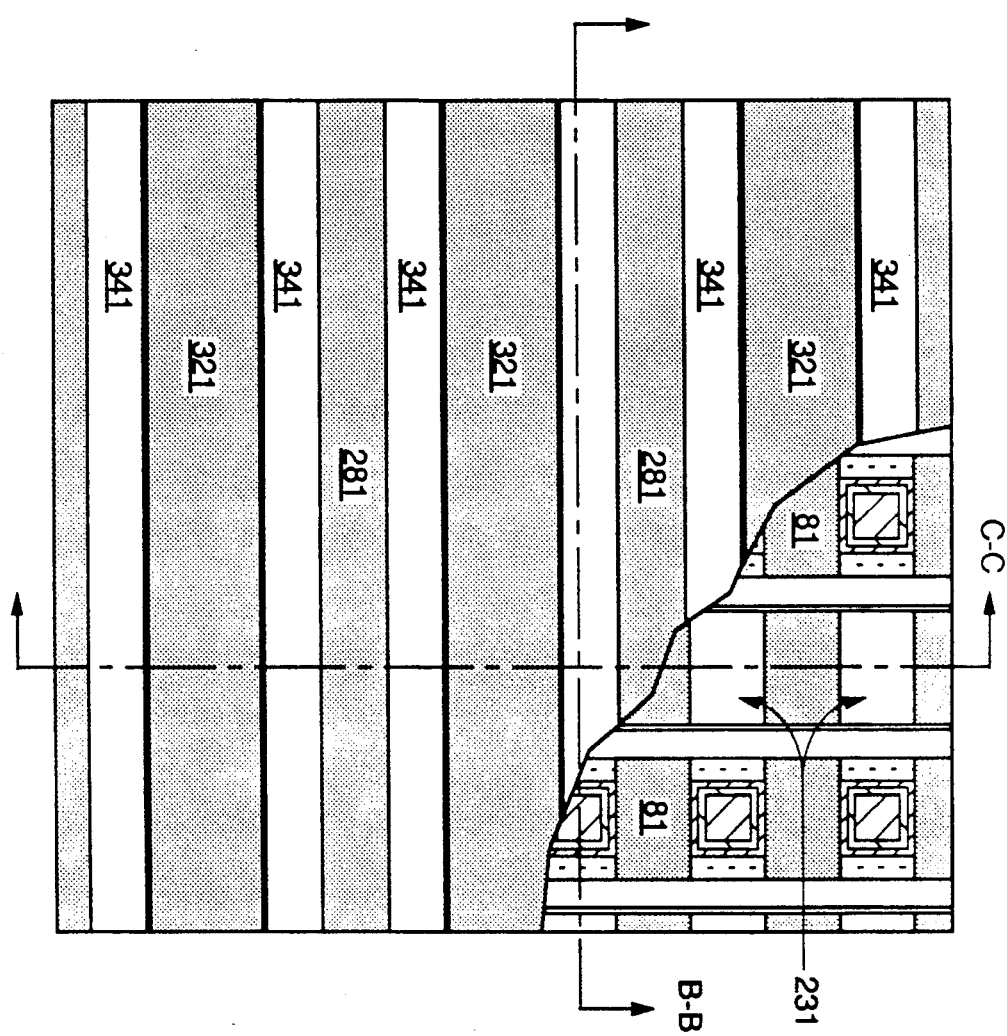

PROCESS FOR FABRICATING A DRAM ARRAY HAVING FEATURE WIDTHS THAT TRANSCEND THE RESOLUTION LIMIT OF AVAILABLE PHOTOLITHOGRAPHY

FIELD OF THE INVENTION

This invention relates to dynamic random access memory arrays characterized by cells having trench-type capacitors, to photolithography techniques used in the fabrication of integrated circuits, to field-effect transistor design, and to techniques for creating both transistors and interconnect lines having width dimensions far less than the feature resolution of the employed photolithographic process.

BACKGROUND OF THE INVENTION

Since the late 1960's, a new generation of dynamic random access integrated memory circuits has been developed approximately every four years. Each generation has been characterized by a halving of device dimensions, resulting in a four-fold density increase over the preceding generation. Increases in DRAM circuit density have been historically limited by two factors: the problem of maintaining cell capacitance as cell area is decreased, and the resolution capability of available photolithographic equipment.

Three-dimensional cell designs and high-performance cell dielectrics are being utilized to maintain sufficient cell capacitance as cell horizontal dimensions are shrunk. The minimum size of features and spaces that a given piece of photolithographic equipment can produce is directly related to its resolution capability. The sum of minimum feature width (F) and minimum space width (S) producible with a given piece of photolithographic equipment is referred to in this disclosure as "minimum pitch". Since, for practical purposes, F can be considered to be equal to S, minimum pitch is, therefore, approximately equal to double the minimum feature width, or 2F. Using contemporary photolithography techniques, one minimum-width line (feature) and one minimum-width space may be defined for a given minimum pitch.

In a contemporary DRAM cell of conventional design, at least two rowlines and two spaces between rowlines (a total width of 4F) must be created within the X-direction width of a cell. Additional X-direction width (typically 2F) is required for the construction of a cell capacitor. This equates to a minimum X-direction width of 6F. In the Y-direction, a digit line and a space between digit lines are required. Added to this minimum total of 2F is at least another width of 1F, additional space required to provide adequate cell capacitance. Thus, total cell area is 6F (the X-direction width) multiplied by 3F (the Y-direction width), or $18F^2$. The actual cell size of contemporary, commercially available DRAMs varies from $16F^2$ to $20F^2$, depending on the actual cell structure and how much horizontal area it requires. Contemporary 4-megabit DRAMs are typically fabricated with photolithographic processes having 0.7 μm minimum feature resolution (i.e., $F=0.7$ μm and minimum pitch=2F or 1.4 μm. Thus, the area of an average $18F^2$ 4-megabit DRAM cell is about 9 μm$^2$.

It has long been recognized, by those skilled in the fabrication of integrated circuits, that vertical film layers as thin as 0.01 μM can be grown with a high degree of accuracy. Isolated vertical film layer segments may be formed by depositing an expendable layer on a substrate, masking and etching the expendable layer down to the substrate such that expendable layer remnants having vertical sidewalls are created, blanket depositing a thin spacer layer over the substrate and expendable layer remnants, performing an anisotropic etch to create spacers on the sidewalls of the expendable layer, and then etching away the expendable layer remnants to leave the spacers. In the early 1980s, Seiki Ogura, Christopher F. Codella, Nivo Rovedo, Joseph F. Shepard and Jacob Riseman of IBM Corp. used this spacer technique to create a half-micron-width MOSFET gate. If a process could be devised in which thin vertical film layers, created using the aforementioned technique, were consistently and repeatedly used to define horizontal dimensions within an integrated circuit, minimum pitch could be dramatically reduced at a given level of photolithographic resolution, resulting in increased circuit density equal to the square of the reciprocal of the reduction factor.

SUMMARY OF THE INVENTION

The present invention provides a process for fabricating a DRAM cell array that is some sixteen to twenty times as dense as contemporary conventional arrays. The process makes full use of edge definition (thin vertical film layer segments created using an anisotropic spacer etch) to define cell structures. In a span of 2F (minimum pitch), two distinct lines and spaces can be defined. Compression of feature width beyond the resolution capability of the photolithographic process, coupled with the use of nonfolded bit lines, allows the fabrication of ultra-dense arrays, in which individual cells have an area of only $1F^2$. Using photolithography with a minimum feature resolution of 0.7 μm, this is equivalent to only 0.5 μm$^2$. Thus, a memory array constructed with this process is sixteen to twenty times as dense as contemporary conventional arrays. This is equivalent to more than a two generation advance over contemporary DRAM technology.

The first stage of the process entails the creation of a series of double-pitch isolation trenches on a wafer of either lightly-doped P-type silicon or heavily-doped P-type silicon on which is epitaxially grown a lightly-doped P-type layer. In order to etch the series of double-pitch trenches, a double-pitch mask must be created. The double-pitch masking process is disclosed in a co-pending U.S. patent application submitted by Tyler Lowrey and Randal Chance, entitled "Method for Reducing by $2^{-N}$ the Minimum Masking Pitch of a Photolithographic Process Used in the Fabrication of an Integrated Circuit", and accorded U.S. Ser. No. 07/519,992. The double pitch mask is created by blanket depositing an expendable layer which can be selectively etched with respect to the silicon (nitride will be used in the example). The expendable layer is then patterned with a first array-patterning photomask consisting of a series of parallel photoresist strips of minimum feature width separated by minimum space width. The photoresist strips are then subjected to an oxygen plasma etch, or other equivalent etch, in order to substantially halve their width. Using these half-width photoresist strips, the expendable layer is anisotropically etched down to the wafer silicon, thus creating expendable material strips having substantially vertical sidewalls. An equivalent, alternative approach to the oxygen plasma etch of the photoresist strips is to add a degree of isotropicity to the etch of the expendable layer (i.e., perform an isotropic etch subsequent to an anisotropic etch), so that the expendable layer is undercut beneath the resist. A first hard-material masking layer, that may be selectively etched in relation to both silicon and the expendable layer (silicon dioxide in this example), and which also has a thickness substantially equal to one-half the minimum feature width of the employed photolithographic process, is then blanket deposited over the wafer and masked in future peripheral regions of the circuitry with photoresist. It is then anisotropically etched to leave a first series of hard-material masking stringers on the sidewalls of the expendable material strips and an expanse of hard material (i.e., silicon dioxide) in future peripheral regions. Following removal of the expendable material strips, the first series of hard-material masking stringers is available for use as a half-pitch, hard-material etch mask. However, prior to using the first series of hard-material masking stringers as an etch mask, they may be optionally rectangularized in accordance with the process disclosed in a copending U.S. patent application submitted by Mark Durcan and Ruojia Lee of Micron Technology, Inc. entitled "Method for Rectangularizing Asymmetrical Spacers in a Process for Reducing Minimum Masking Pitch" and accorded U.S. Ser. No. 07/526,079. With the first series of hard-material masking stringers used as an etch mask and with the expanse of hard material protecting future peripheral regions of the circuitry, an anisotropic etch selective for silicon over silicon dioxide creates a series of double-pitch isolation trenches in the wafer silicon to a depth sufficient to provide isolation between storage trenches which are created in the second stage of the process. Following removal of the first series of hard-material masking stringers, conformal deposition of an insulative material (silicon dioxide is but one possibility) is used to completely fill the isolation trenches. A planarization etchback process is then performed. The result is a striped pattern of insulative-material-filled trenches.

The second stage of the process involves the creation of an array of storage trenches. This is accomplished by performing a blanket deposition of a second hard-material masking layer (e.g., silicon dioxide) on the wafer surface, and masking the second hard-material masking layer with a second array-patterning photomask, which like the first array-patterning photomask, consists of a series of parallel photoresist strips of minimum feature width separated by minimum space width. However, the strips of the second photomask are perpendicular to the direction in which the strips of the first photomask were oriented. An anisotropic etch is then employed to etch the exposed portions of the second hard-material masking layer down to the level of the silicon, thus creating a series of hard-material masking strips having substantially vertical sidewalls. Subsequently, a third hard-material masking layer having a thickness substantially equal to one-quarter the minimum feature width of the employed photolithographic process is blanket deposited on top of the wafer, then anisotropically etched to leave a second series of hard-material masking stringers on the vertical sidewalls of the hard-material masking strips. The hard-material masking strips and associated second series of hard-material masking stringers, which have a combined feature width substantially equal to 1.5F and are separated by spaces that are substantially equal to 0.5F, are then used as a hard-material mask during a second anisotropic etch that is selective for silicon, thus creating storage trenches in the wafer silicon. The trench depth is chosen to sustain ample signal margin for a sense amp read. The trenches are then cleaned by any one of a number of conventional techniques. Next, N+ junctions are created on the vertical silicon walls of the storage trenches using angled implantation or diffusion of an N-type dopant such as arsenic or phosphorus (preferably arsenic). An optional high-temperature step may be employed to drive the N-type dopant more deeply into the walls of the storage trenches. An optional angled implant using a P-type impurity such as boron, may be performed at this time in order to improve punch-through isolation between storage trenches. The storage trenches are then deepened with a subsequent anisotropic etch in order to isolate the N+ junctions on the opposing walls within each storage trench. Conformal deposition of a thin dielectric layer, such as silicon nitride, follows. A thermal oxidation step cures any imperfections in the dielectric layer, which is then coated with a thin protective layer of polysilicon. A further anisotropic etch is then used to remove both the polysilicon and the dielectric from the bottom of the trench. A polysilicon deposition with in-situ P-type doping follows, completely filling the trenches. The polysilicon filling the trenches electrically contacts the P-type silicon substrate of the wafer at the bottom of each storage trench. The surface of the wafer is then planarized down to the upper surface of the wafer substrate, using one of several available techniques such as mechanical polishing or using a non-selective anisotropic etch in conjunction with spun-on glass or photoresist.

The third stage of the process involves pass-gate definition. A third array-patterning photomask, consisting of a third series of photoresist strips of minimum feature width and separated from one another by minimum space widths, is created on the wafer such that the photoresist strips thereof are perpendicular to the oxide isolation trenches and centered between the rows of storage node trenches. The resist is then subjected to an oxygen plasma etch to reduce strip width to substantially $\frac{3}{4}$F (F being minimum feature width). The resist is then used to mask an anisotropic etch which etches both silicon and oxide to a depth needed to provide sufficient channel length for FET access transistors which will be later formed on the substantially vertical sidewalls of the silicon-oxide wordline mesas that are formed in this step. As an alternative to the photoresist plasma etch, an isotropic component can be added to the silicon-oxide etch. After a resist strip, any protruding dielectric layer spires are removed with a short isotropic dielectric etch. A gate oxidation step is then performed, creating a high-quality oxide layer in the range of 50-500 angstroms in thickness. This is followed by the deposition of polysilicon and doping in-situ or subsequent to deposition. An unmasked anisotropic poly etch having high selectivity to oxide is then performed to create both wordlines and cell access transistor gates. A certain amount of overetch is required to assure that the polysilicon of the wordlines is recessed below the tops of the silicon segments of the silicon-oxide mesas. An N-type source/drain implant is then used to form the connector to the trench sidewall and to create a bit line junction on top of the mesa. At this point, an optional refractory metal deposition and selective strapping of the exposed polysilicon can be accomplished in order to reduce wordline resistance for optimum performance. For example, titanium metal may be deposited, annealed in a nitrogen ambient, and selectively etched to leave TiSi$_2$ only on the top and sides of the wordline. This completes the transistor formation stage, resulting in field-effect transistors having source/drain regions which are only heavily doped and have no punch-through halo implant. Higher performance transistors may be created with additional processing steps which may include sacrificial oxide growth to help ensure a cleaner gate oxide layer and to create larger radius of curvature at the base corner of each wordline pass-gate section, and additional implantation steps to create halo punch-through-resistant regions as well as LDD source and drains.

The fourth stage of the process involves bitline formation. A layer of a dielectric (such as silicon dioxide) is conformally deposited on the surface of the wafer and planarized using one of the aforementioned techniques such that the oxide layer remaining is approximately F/2 in thickness above the silicon-oxide mesa created in stage three. A fourth array-patterning photomask, consisting of a fourth series of parallel photoresist strips having minimum feature width and separated from one another by minimum space widths, is created on the wafer such that the photoresist strips thereof are parallel to the isolation trenches and substantially centered thereupon. The resist is then subjected to an optional oxygen plasma etch to reduce strip width to approximately 0.75F. The resist is then used as a mask for an anisotropic oxide etch that etches the planarized silicon dioxide layer to a level equal to, or just below the height of the silicon-oxide mesa created in stage three, but not to a level that uncovers the polysilicon wordlines. A series of oxide mesas having substantially vertical sidewalls have been formed. As an alternative to the optional photoresist plasma etch, an isotropic component can be added to the oxide etch. After resist strip, an optional thin "glue layer" of a material such as titanium nitride is blanket deposited on the wafer (or formed thereon by various other techniques such as titanium deposition followed by furnace anneal or rapid-thermal-processing anneal in a nitrogen ambient). This is followed by a conformal deposition of metal layer such as tungsten. The optional glue layer facilitates the adhesion of metal to oxide. Next, an anisotropic etch is used to etch the metal layer so that metal remains only as metal stringer strips along the sidewalls of the oxide mesa. The thickness of the conformal metal layer is chosen so as to achieve maximum coverage of the N+ regions on the silicon-oxide mesas and achieve minimal series resistance, without producing shorts between tungsten conductive lines of adjacent oxide mesas.

This completes the processing steps required to complete the memory array. Processing of the array periphery can be accomplished with either similar high-density techniques or more conventional techniques, if desired. The repeating cell area is 1F by 1F. Each cell is uniquely addressable using conventional non-folded bitline architecture. Cell capacitance can be varied, as necessary, by adjusting the depth of the storage trenches.

BRIEF DESCRIPTION OF THE DRAWINGS

FIG. 7A is a cross-sectional view of the array portion of FIG. 6 following an anisotropic etch of the substrate with the first series of hard-material masking stringers serving as a first hard-material etch mask, resulting in the creation of a series of parallel isolation trenches;

FIG. 9A is a cross-sectional view of the array portion of FIG. 8 following planarization of the trench-filling insulative layer to the level of the substrate;

FIG. 10B is a cross-sectional view of the array portion of FIG. 10A taken through broken line B—B;

FIG. 13 is a cross-sectional view of the array portion of FIG. 12 following the anisotropic etch of the third hard-material masking layer to the extent that a second series of hard-material masking stringers is formed on the vertical sides of each hard-material masking strip and the silicon substrate between facing stringers is exposed, thus creating a second hard-material etch mask;

FIG. 14A is a top plan view of the array of FIG. 13 following an anisotropic etch of the substrate masked with the second hard-material etch mask, thus creating a series of storage trenches in the substrate;

FIG. 14C is an isometric view of the array of FIG. 14A;

FIG. 29A is a top plan view of the array, a portion of which is depicted in FIG. 28, following planarization of the separation layer;

FIG. 29B is a cross-sectional view of a portion of the array of FIG. 29A, taken through broken line B—B;

FIG. 34A is a top plan view of the array of FIG. 33 following an anisotropic etch of the metal layer and the glue layer down to the wordline mesa substrate level;

PREFERRED EMBODIMENT OF THE INVENTION

The process for creating an ultra-dense DRAM array having feature widths that transcend the resolution limit of the employed photolithographic process requires only five photomasking steps in the memory array, one of which is required to protect peripheral substrate from etches used to trench array substrate.

The first stage in the fabrication of this ultra-dense DRAM array is the creation of a series of oxide-filled, equidistantly-spaced, double-pitch isolation trenches in a silicon substrate using a half-pitch, hard-material (silicon dioxide) etch mask created using the process disclosed in the aforereferenced, co-pending application submitted by Messrs. Lowrey and Chance. The starting substrate material for an NMOS array is a planarized, lightly-doped P-type silicon substrate or, optionally, a planarized, heavily-doped P-type silicon substrate on which has been epitaxially grown a 0.5 to 20 micron-thick layer of lightly-doped silicon. The actual thickness of the epitaxially-grown layer will ultimately depend on employed trench depths.

Figure 1:
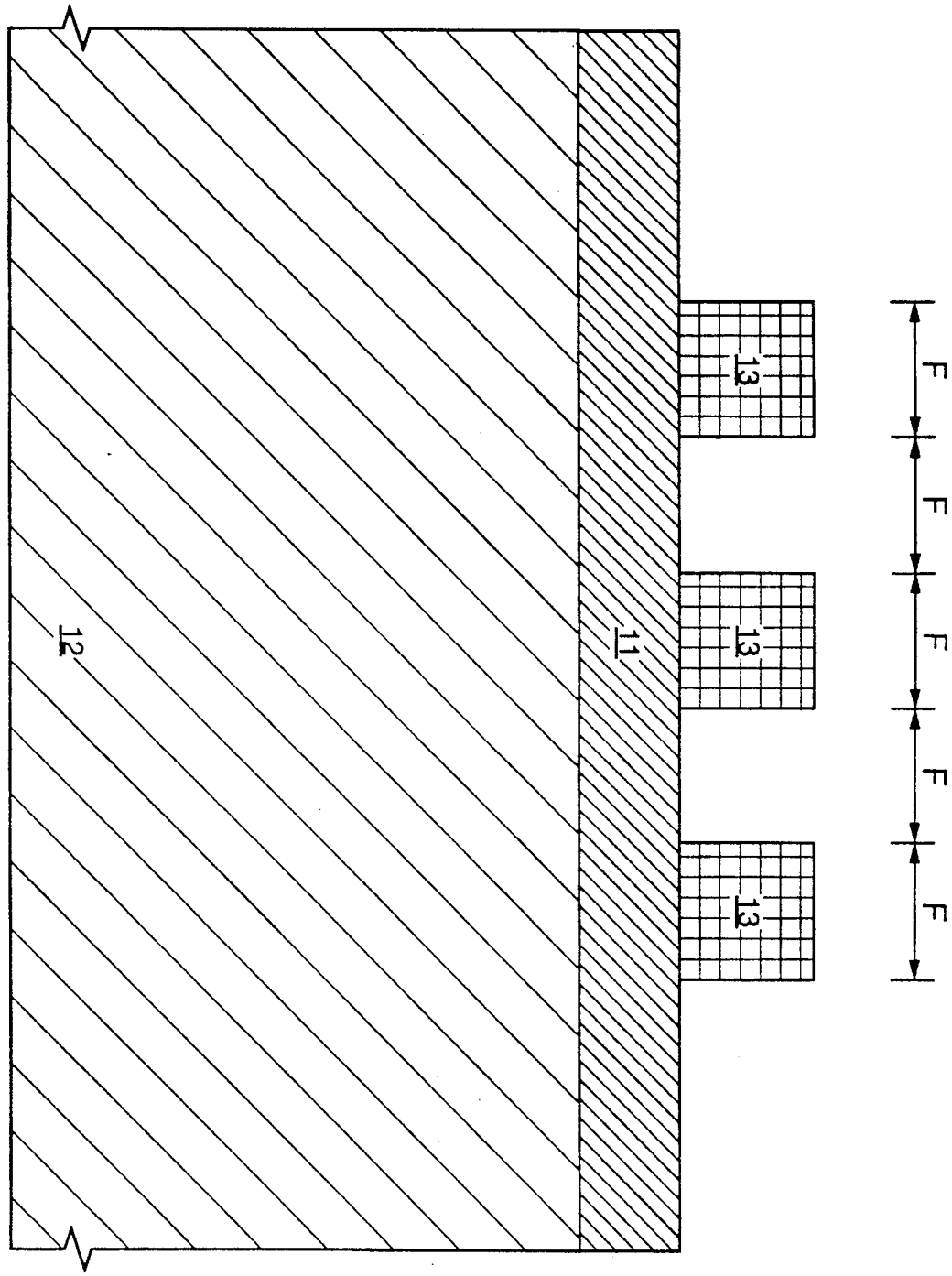
FIG. 1 is a cross-sectional view through a portion of a dynamic random access memory array at the beginning of the fabrication process which is the focus of the invention, said view depicting a silicon substrate, on which has been deposited a superjacent expendable layer (silicon nitride is used in the description of the preferred embodiment of the process), said expendable layer having been masked with a first photomask consisting of a first series of parallel photoresist strips created using maximum resolution of the available photolithographic process, said strips having substantially identical width, and separated from one another by gaps having a width substantially equal to photoresist strip width.

Referring now to FIG. 1, an expendable silicon nitride layer (herein also referred to as "expendable material layer") is blanket deposited on the silicon substrate 12. Expendable silicon nitride layer 11 is then masked with a first array-patterning photomask, which consists of a first series of parallel photoresist strips 13 created using maximum resolution of the available photolithographic process, said strips having substantially identical width, and separated by gaps having a width substantially equal to the width of the photoresist strips.

It is now necessary to transfer the pattern of the first series of photoresist strips 13 to expendable silicon nitride layer 11 with a concomitant reduction of feature widths and a corresponding augmentation of space widths. This may be accomplished using one of at least three techniques. The first technique involves reducing the width of each photoresist strip of said first series 13 prior to an anisotropic etch; the second technique reduces the width of the strips of the nitride pattern elements with an isotropic etch, subsequent to the anisotropic etch of expendable silicon nitride layer 11; and the third technique utilizes a single etch having an isotropic component which both patterns and undercuts expendable silicon nitride layer 11. A detailed description will be given of only the first technique in this application, as the other two techniques are adequately disclosed in the aforementioned copending patent application.

Figure 2:
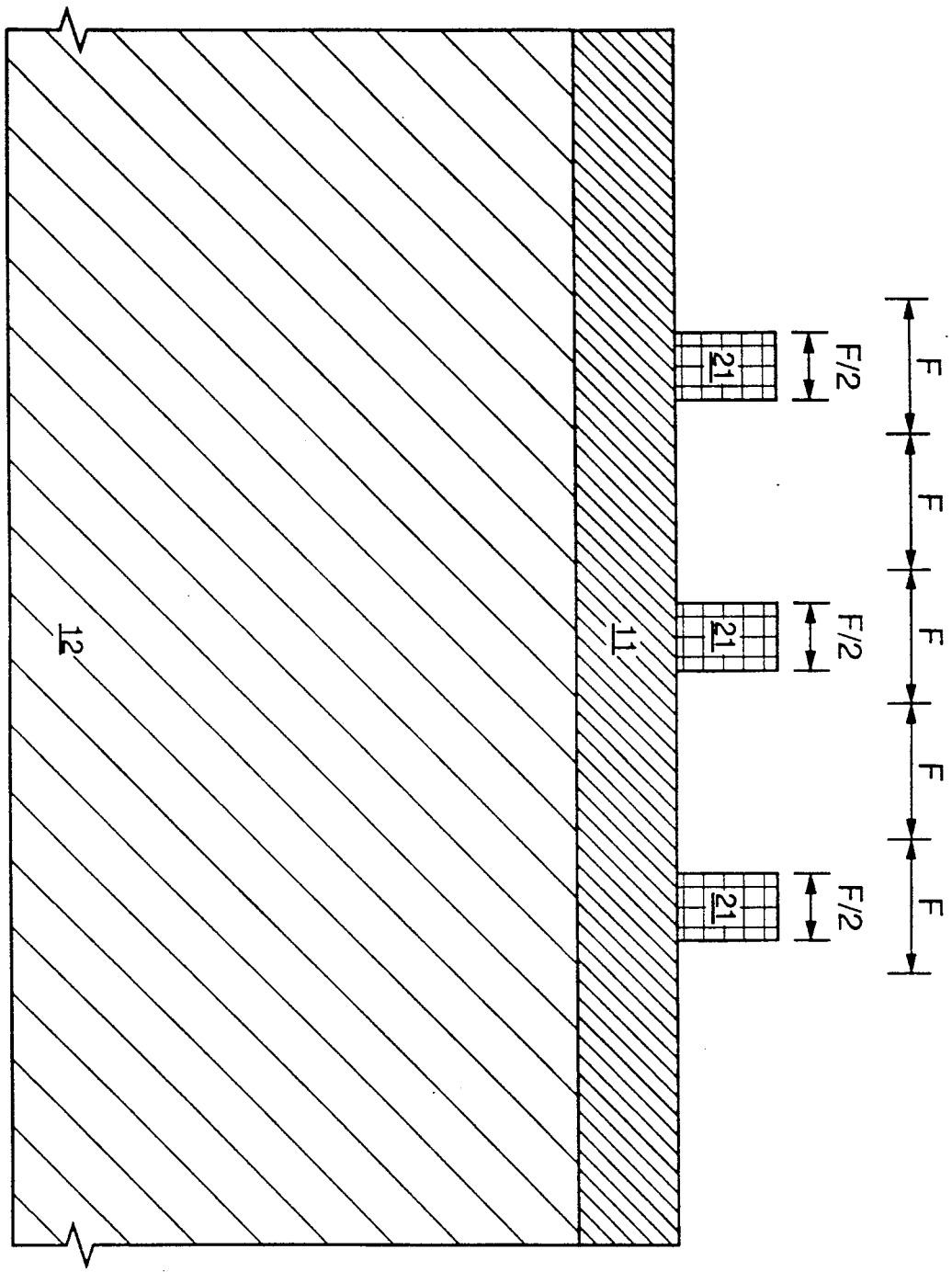
FIG. 2 is a cross-sectional view of the array portion of FIG. 1 following an oxygen plasma etch step, which reduces the height and width of the photoresist strips.

Referring now to FIG. 2 and utilizing the first of the three mentioned techniques, first series of photoresist strips 13 is subjected to an isotropic oxygen plasma etch, which creates a plasma-etched first series of photoresist strips 21, each strip there having a width substantially equal to F/2. Although the oxygen plasma etch step has also reduced the height of the photoresist strips, the original photoresist layer thickness is adjusted such that the final photoresist thickness constitutes an adequate etch mask.

Figure 3:
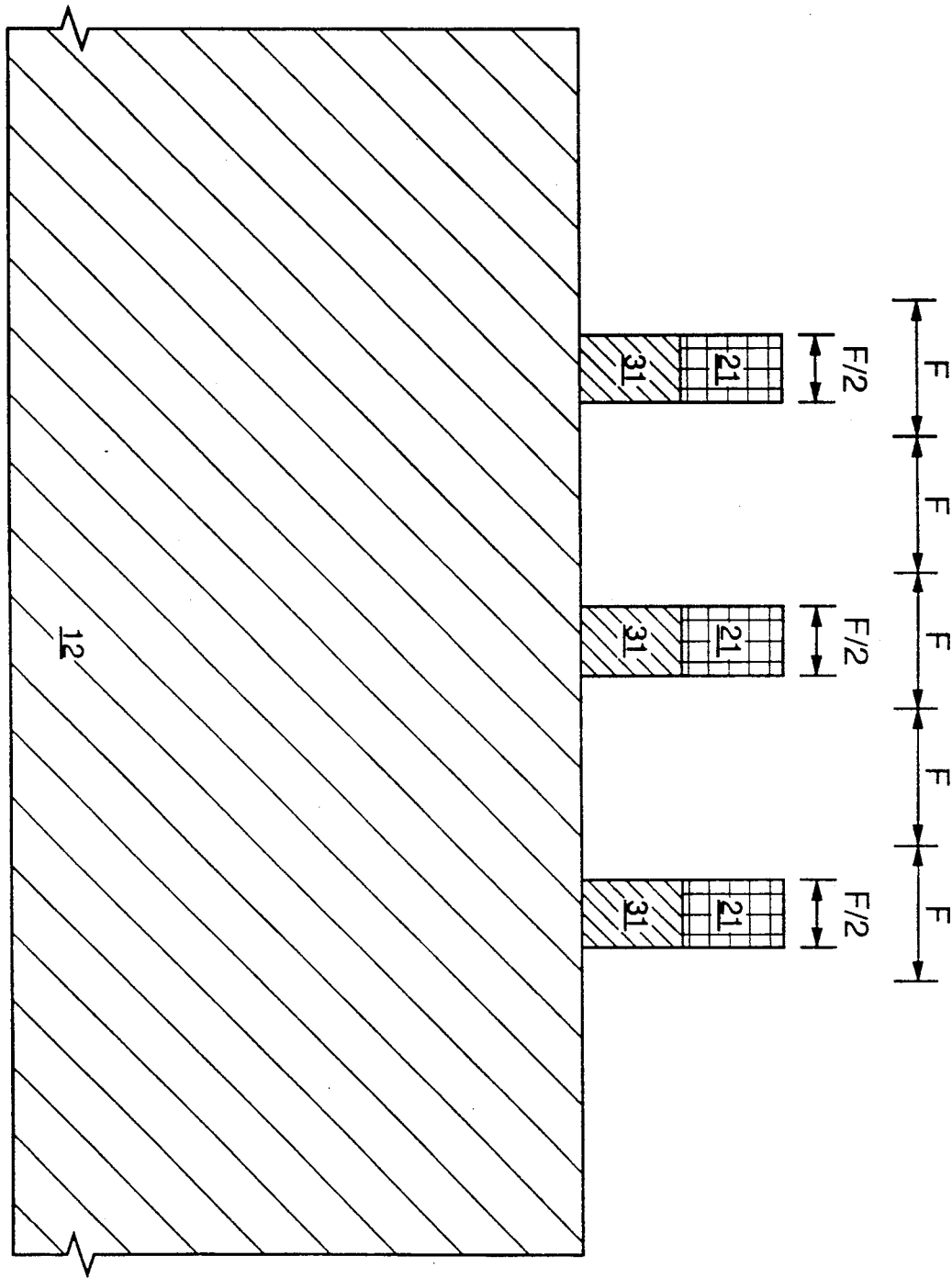
FIG. 3 is a cross-sectional view of the array portion of FIG. 2 following patterning of the expendable material layer.

Referring now to FIG. 3, expendable silicon nitride layer 11 has been subjected to an anisotropic nitride etch which has removed all silicon nitride that was not subjacent plasma-etched photoresist strips 21, resulting in a series of narrow, parallel silicon nitride strips (also referred to herein as "expendable material strips") 31 that reflect the pattern of plasma-etched photoresist strips 21.

Figure 4:
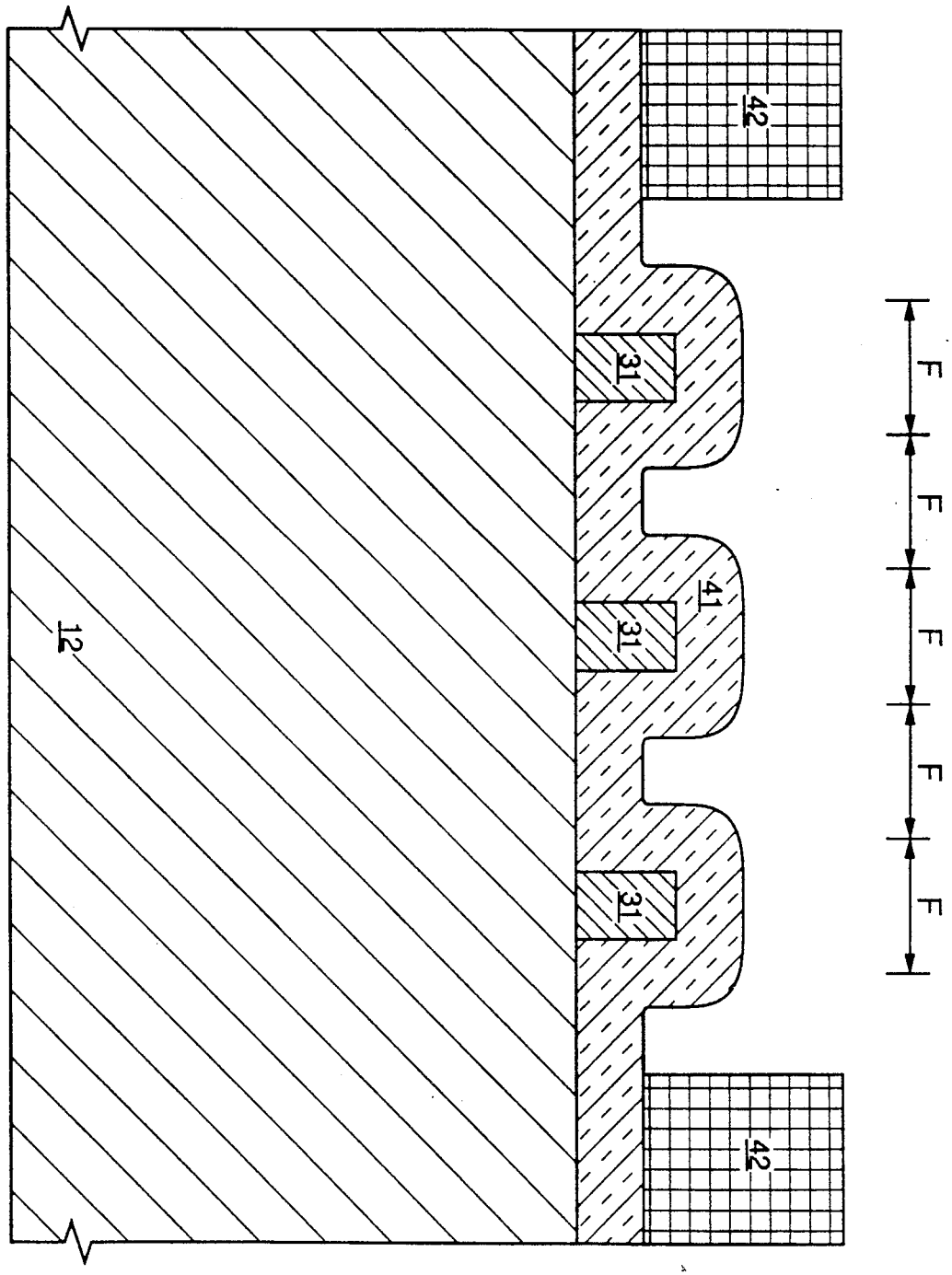
FIG. 4 is a cross-sectional view of the array portion of FIG. 3 following photoresist strip, the conformal blanket deposition of a first hard-material masking layer (silicon dioxide is used in the description of the preferred embodiment of the process), and masking of the first hard-material masking layer in future peripheral regions of the circuitry with photoresist.

Referring now to FIG. 4, following a photoresist strip, a first silicon dioxide hard-material masking layer 41 is conformally deposited on the circuitry of FIG. 3 (actually on the entire in-process wafer), said first hard-material masking layer having a thickness substantially equal to the width of silicon nitride strips 31. First hard-material masking layer 41 thus covers both silicon nitride strips 31 and the exposed portions of silicon substrate 12 between silicon nitride strips 31. Future peripheral regions of the circuitry are then masked with a peripheral photoresist mask 42.

Figure 5:
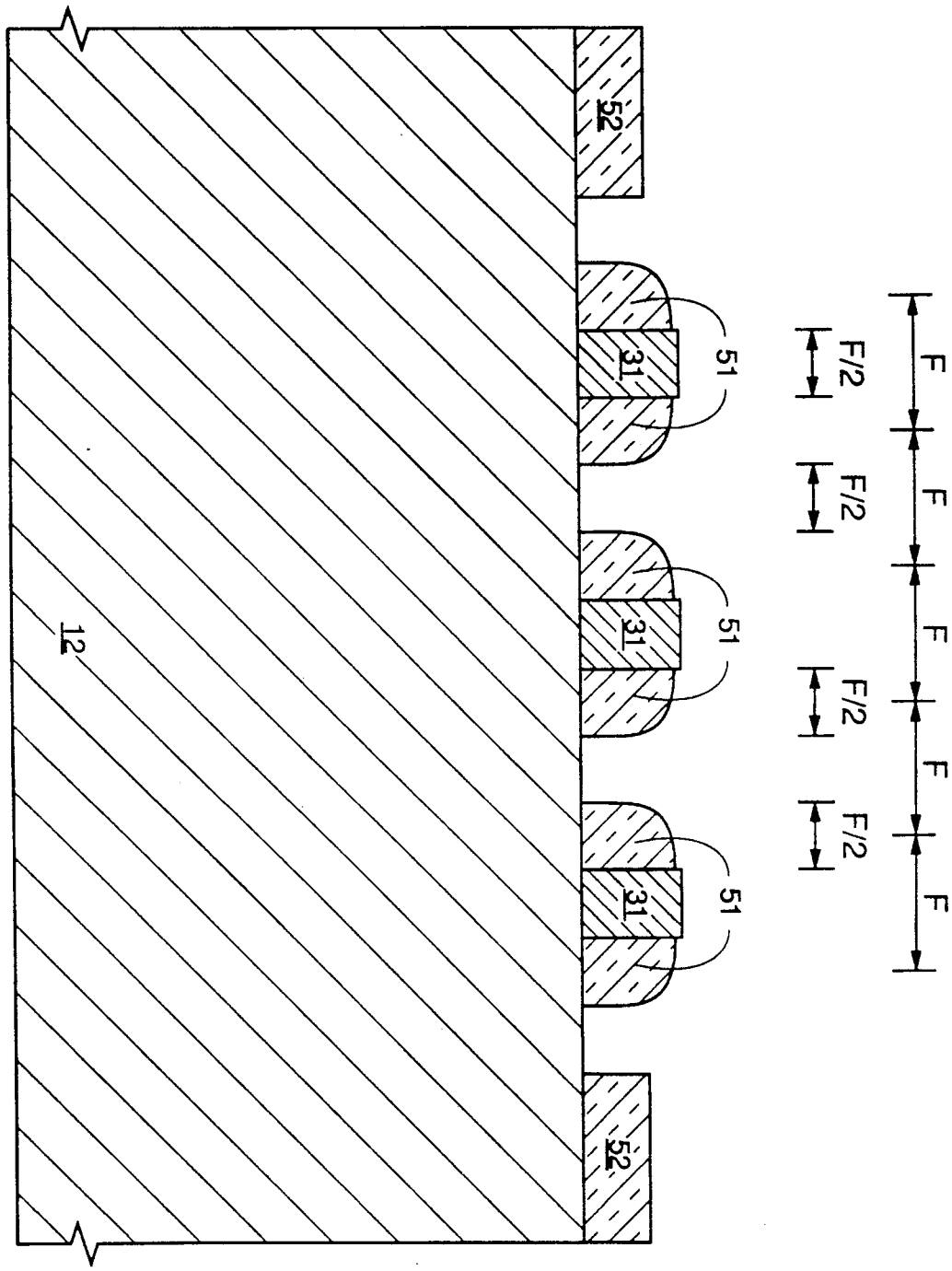
FIG. 5 is a cross-sectional view of the array portion of FIG. 4 following an anisotropic etch of the first hard-material masking layer, to the point where the upper surface of each expendable-material-layer remnant and the silicon substrate surface is exposed, and the subsequent removal of photoresist.

Referring now to FIG. 5, first hard-material masking layer 41 has been anisotropically etched to the point where both the silicon substrate 12, and the tops of nitride strips 31 are exposed. A hard-material (silicon dioxide) masking stringer 51 remains on each side of each nitride expendable material strip 31. Peripheral photoresist mask 42 has prevented the etching away of those portions of hard-material masking layer 41 that are subjacent thereto. Those remaining portions of the hard-material masking layer 41 in the peripheral regions will be referred to hereinafter as hard-material peripheral mask 52. At this point peripheral photomask 42 is stripped.

Figure 6:
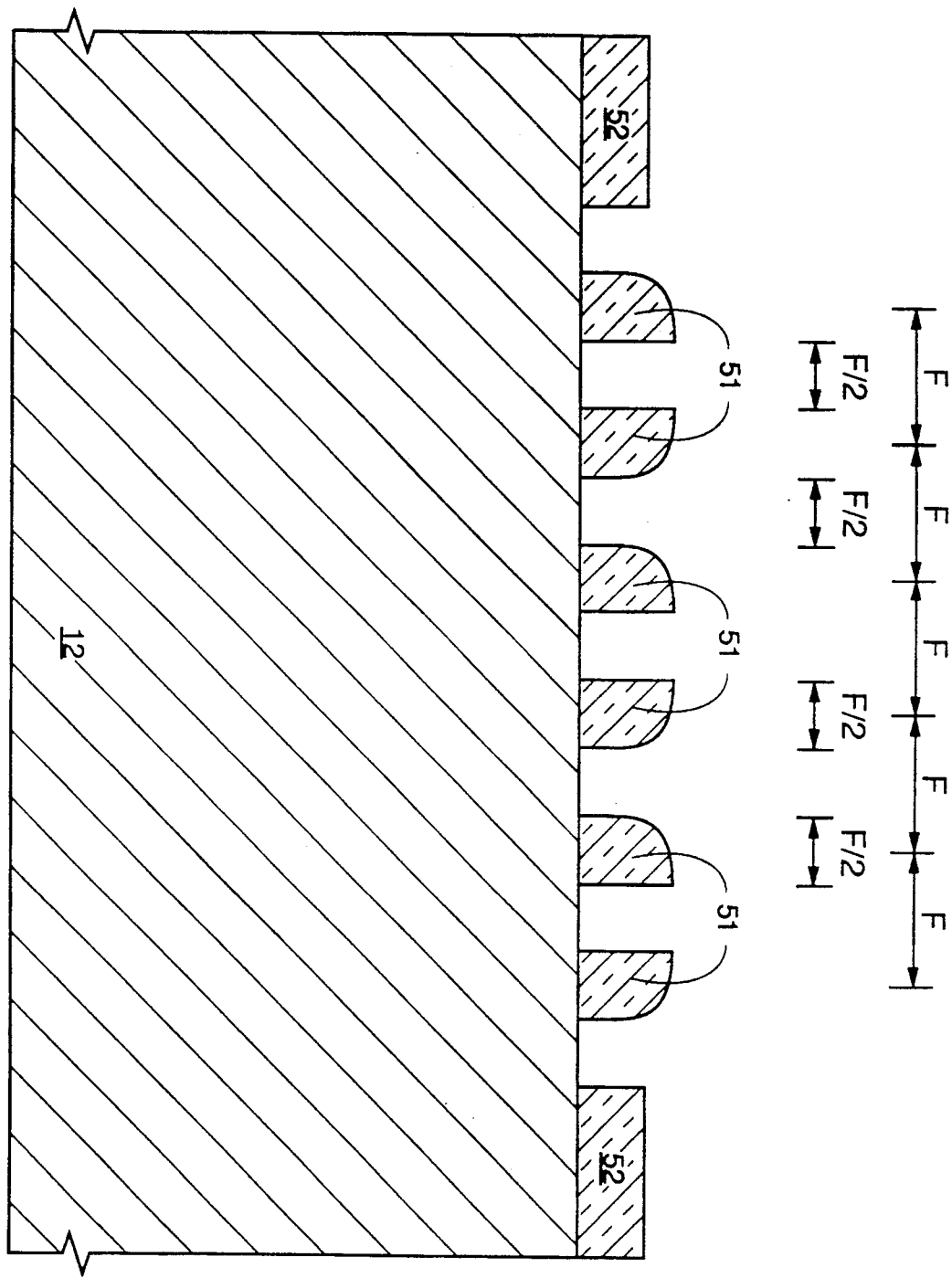
FIG. 6 is a cross-sectional view of the array portion of FIG. 5 following a selective etch which has removed all expendable-material-layer remnants, leaving a first series of hard-material masking stringers.

Referring now to FIG. 6, silicon nitride strips 31 have been etched away with an isotropic nitride etch. An array of hard-material masking stringers 51, substantially equidistantly spaced on the upper surface of substrate 12, in addition to hard-material peripheral mask 52, remain.

Figure 7B:
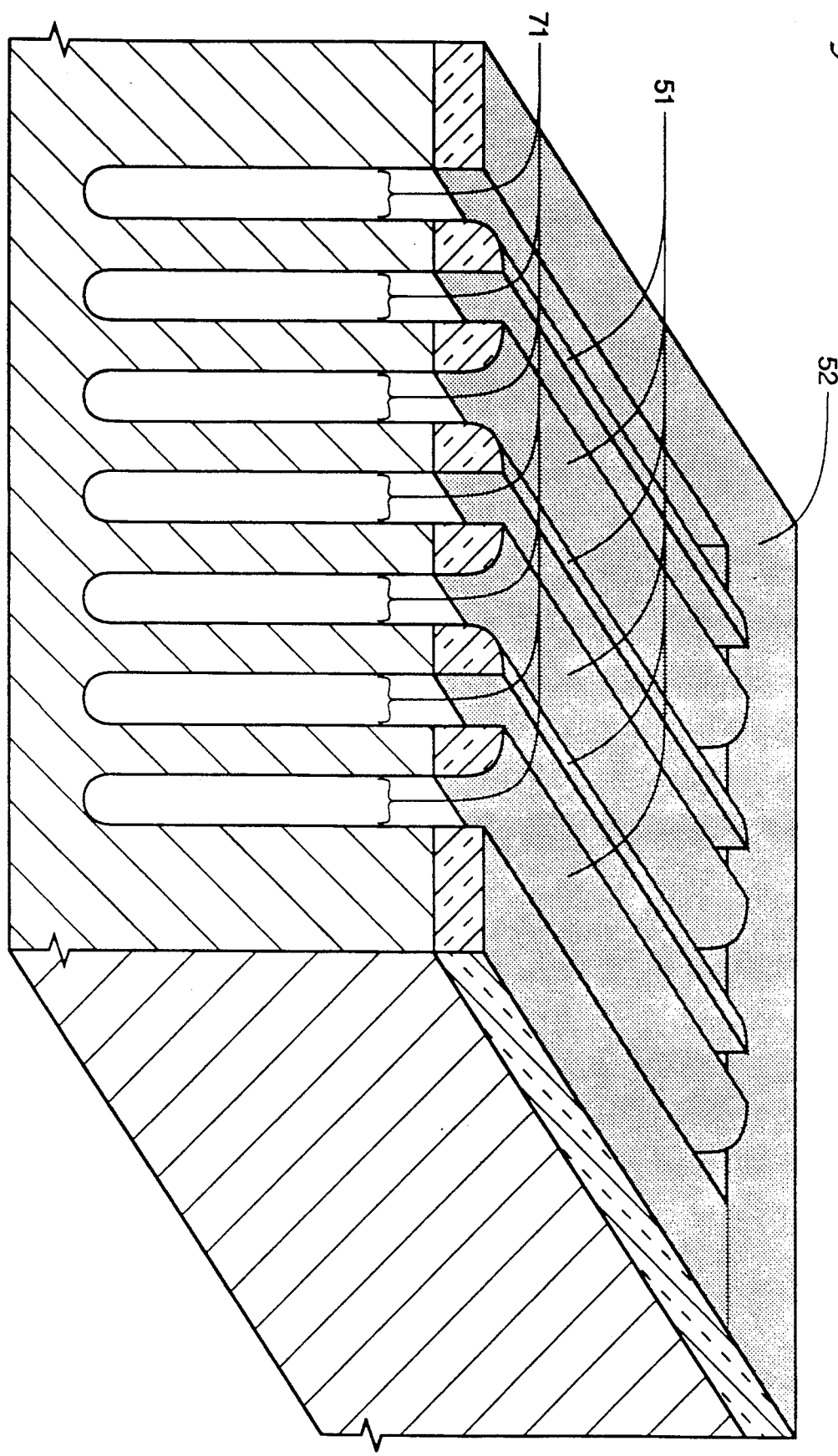
FIG. 7B is an isometric view of the array portion of FIG. 7A.

Referring now to FIG. 7A, substrate 12 is anisotropically etched using an etch that is highly selective for silicon over silicon dioxide, with the array of hard-material masking stringers 51 and hard-material peripheral mask 52 functioning as an etch mask. A series of parallel isolation trenches 71 has been formed in substrate 12 in the array region of the circuitry, each trench having a width substantially equal to F/2 and being separated from neighboring trenches by a space also substantially equal to F/2. Feature definition having twice the maximum resolution of the original masking process has resulted. In FIG. 7B, isolation trenches 71 are shown in an isometric view. Both hard-material peripheral mask 52 and silicon hard-material masking stringers 51 are removed following the etching of isolation trenches 71.

Figure 8:
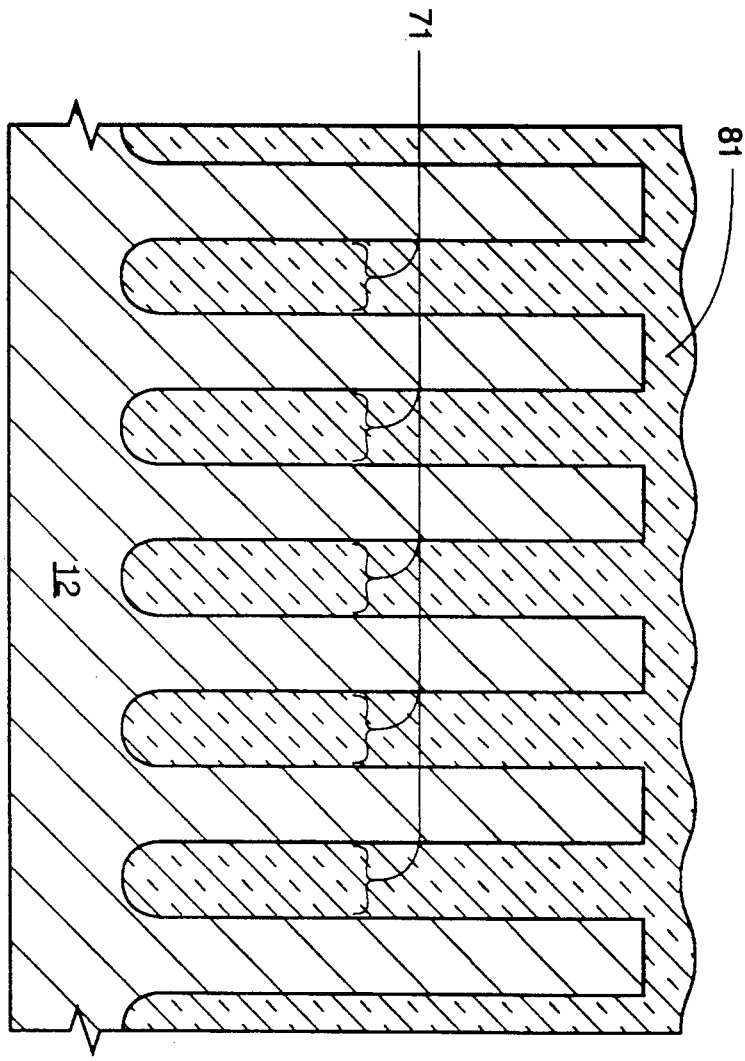
FIG. 8 is a cross-sectional view of the array portion of FIG. 7A following the stripping of the hard-material masking stringers with an isotropic oxide etch and the subsequent conformal deposition of a trench-filling insulative layer (silicon dioxide layer is used in the description of the preferred embodiment of the process)

Referring now to FIG. 8, trench-filling silicon dioxide insulative material 81 is conformally deposited such that the isolation trenches become filled and the array surface becomes completely covered with excess trench-filling silicon dioxide 81.

Figure 9B:
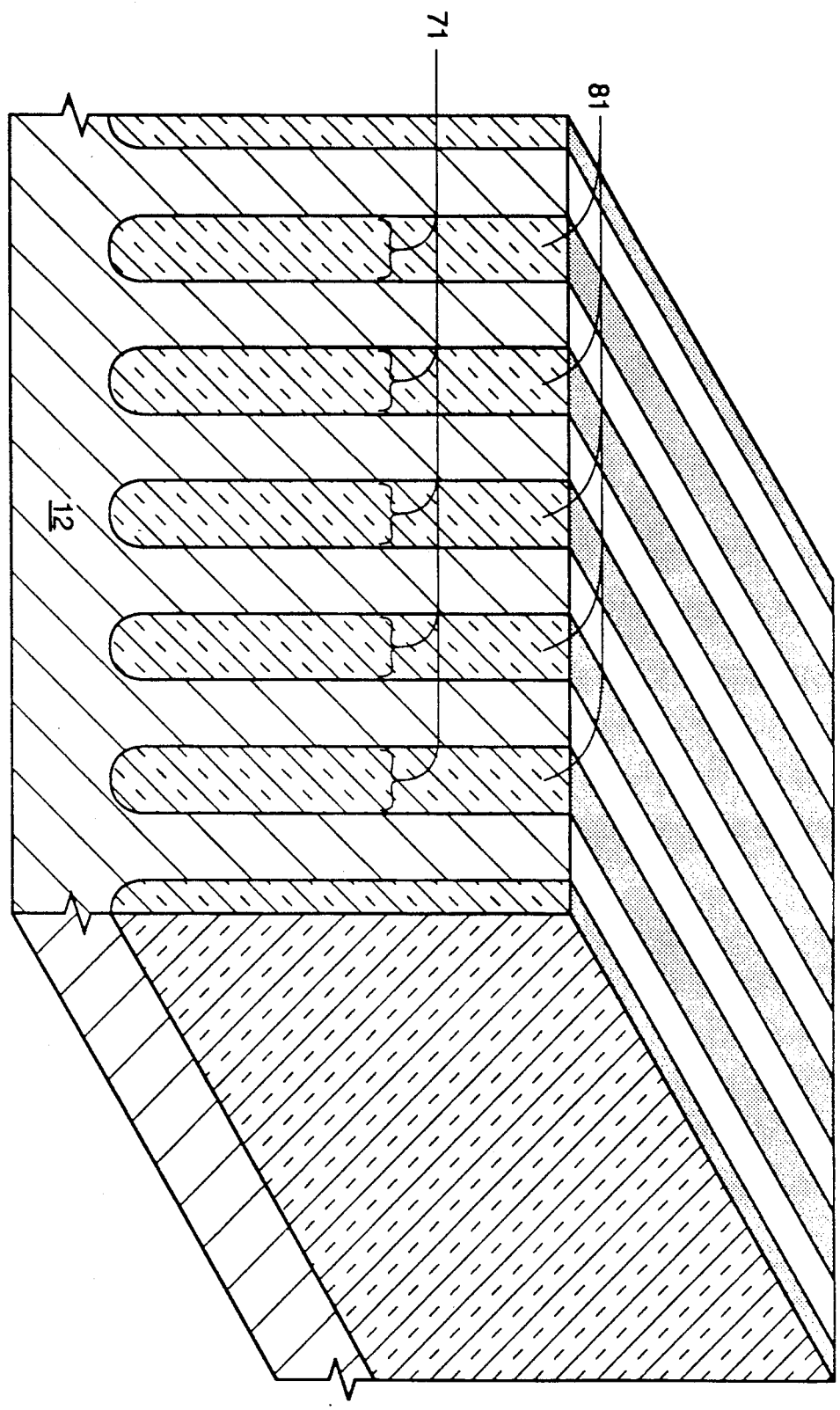
FIG. 9B is an isometric view of the array portion of FIG. 9A.

Referring now to FIG. 9A, the surface of the array is planarized back to the level of substrate 12. FIG. 9B shows the planarized array portion in an isometric view.

The second stage in the fabrication of the DRAM array is the creation of matrix of polysilicon-filed storage trenches, each of which will contain a pair of storage-node capacitors, each of which will be capable of storing a bit of memory data. The storage trenches are etched using an oxide mask consisting of strips that are substantially 1½F in width, separated by spaces that are substantially 1½F in width, the orientation of the strips being perpendicular to that of the mask strips used to create the isolation trenches.

Figure 10A:
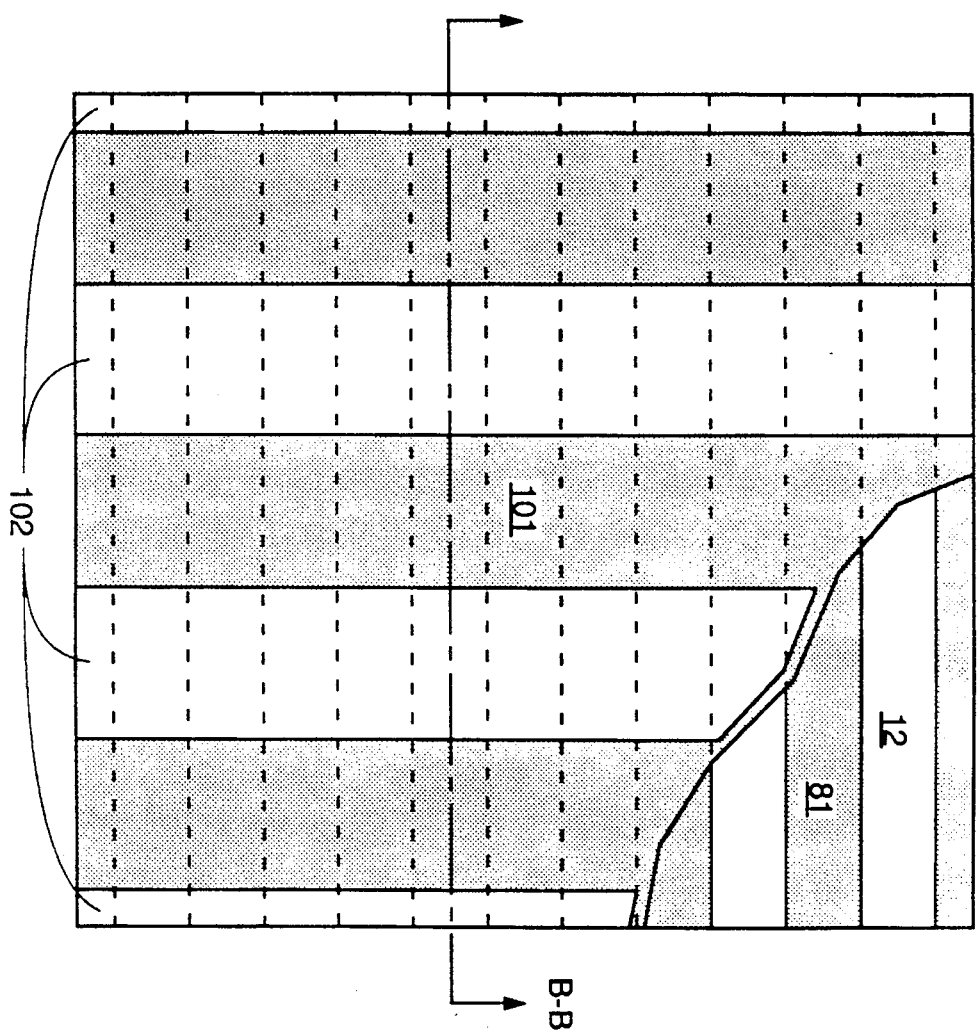
FIG. 10A is a top plan view of the array portion of FIG. 9A following the deposition of a second hard-material masking layer (silicon dioxide is used for the description of the preferred embodiment of the process) and the masking thereof with a second photomask consisting of a second series of parallel photoresist strips applied perpendicularly to the direction of said first series of photoresist strips (relative to the surface of the substrate), and created using the maximum resolution of the photolithographic process, said second series of strips having substantially identical width, and being separated by gaps having a width substantially equal to photoresist strip width.

Referring now to FIG. 10A, a second silicon dioxide hard-material masking layer 101 is blanket deposited over the array surface, subsequent to which it is masked with a second array-patterning photomask consisting of a second series of parallel photoresist strips 102 that are created perpendicular to the direction of said first series of photoresist strips (relative to the surface of the substrate) using the maximum resolution of the photolithographic process. All strips of said second series have substantially identical width, and are separated by gaps having a width substantially equal to the width of the photoresist strips. FIG. 10B is a cross-sectional view of the photoresist-masked, second hard-material layer-coated array region taken through broken line B—B of FIG. 10A. Broken line 103 represents the depth limit of the series of isolation trenches 71.

Figure 11:
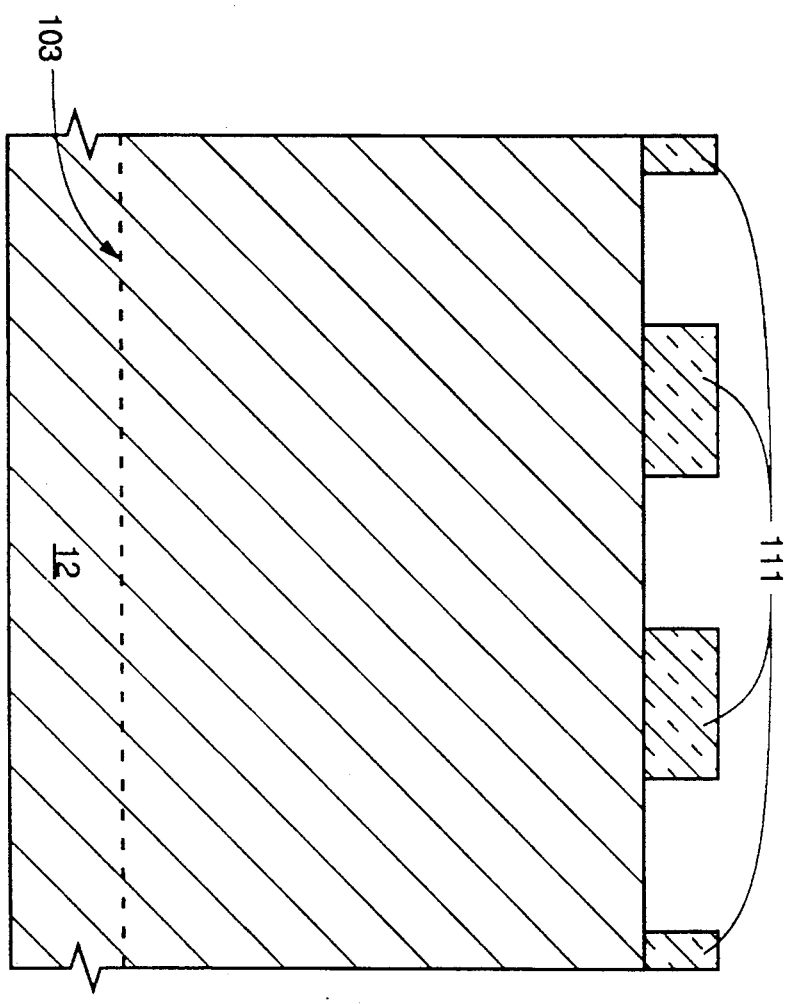
FIG. 11 is a cross-sectional view of the array portion of FIG. 10A following an anisotropic etch of the second hard-material masking layer down to the level of the substrate, and subsequent removal of photoresist.

Referring now to FIG. 11, an anisotropic etch of the second hard-material masking layer 101 down to the level of substrate 12 has created a series of parallel hard-material silicon dioxide masking strips 111, each having a width equal to F and separated one from another by spaces equal to F. This view depicts the array following the stripping of the second series of parallel photoresist strips 102.

Figure 12:
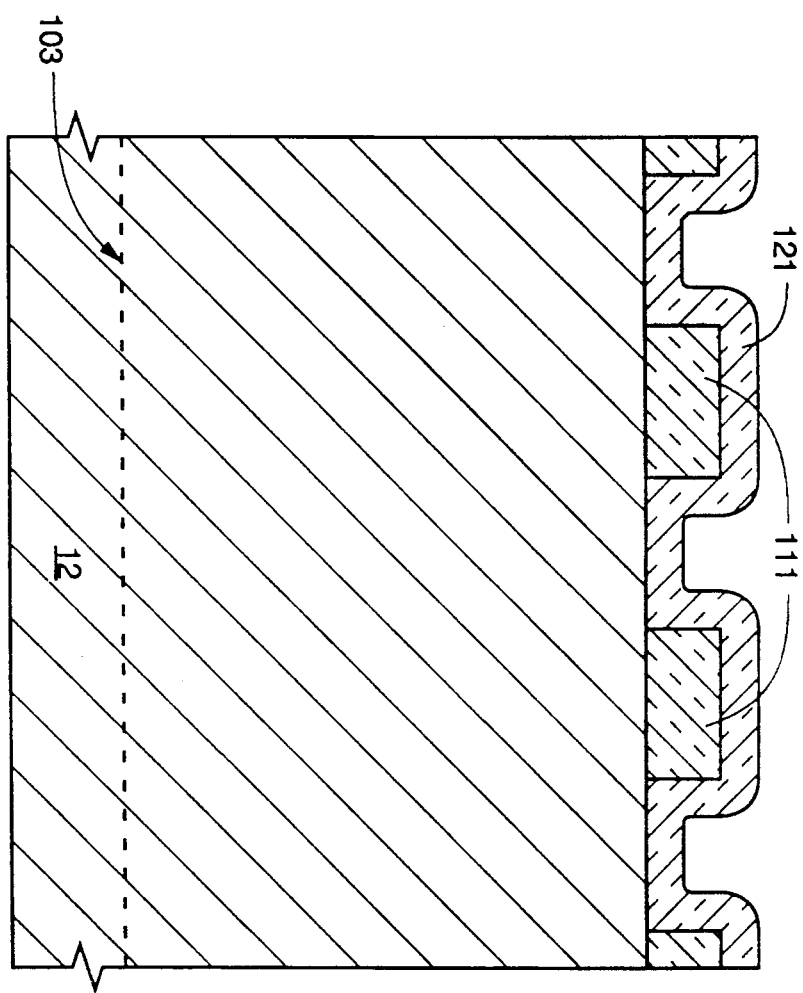
FIG. 12 is a cross-sectional view of the array portion of FIG. 11 following the conformal deposition of a third hard-material masking layer (silicon dioxide is used for the description of the preferred embodiment of the process)

Referring now to FIG. 12, a third hard-material silicon dioxide masking layer 121 having a thickness substantially equal to F/4 has been blanket conformally deposited on top of the array.

Referring now to FIG. 13, third hard-material masking layer 121 has been anisotropically etched down to the level of substrate 12, creating a second series of hard-material masking stringers 131 on the substantially vertical edges of hard-material masking strips 111. A storage-trench etching mask 132 has thus been created which consists of hard-material masking strips 111 and the second series of hard-material masking stringers 131.

Figure 14B:
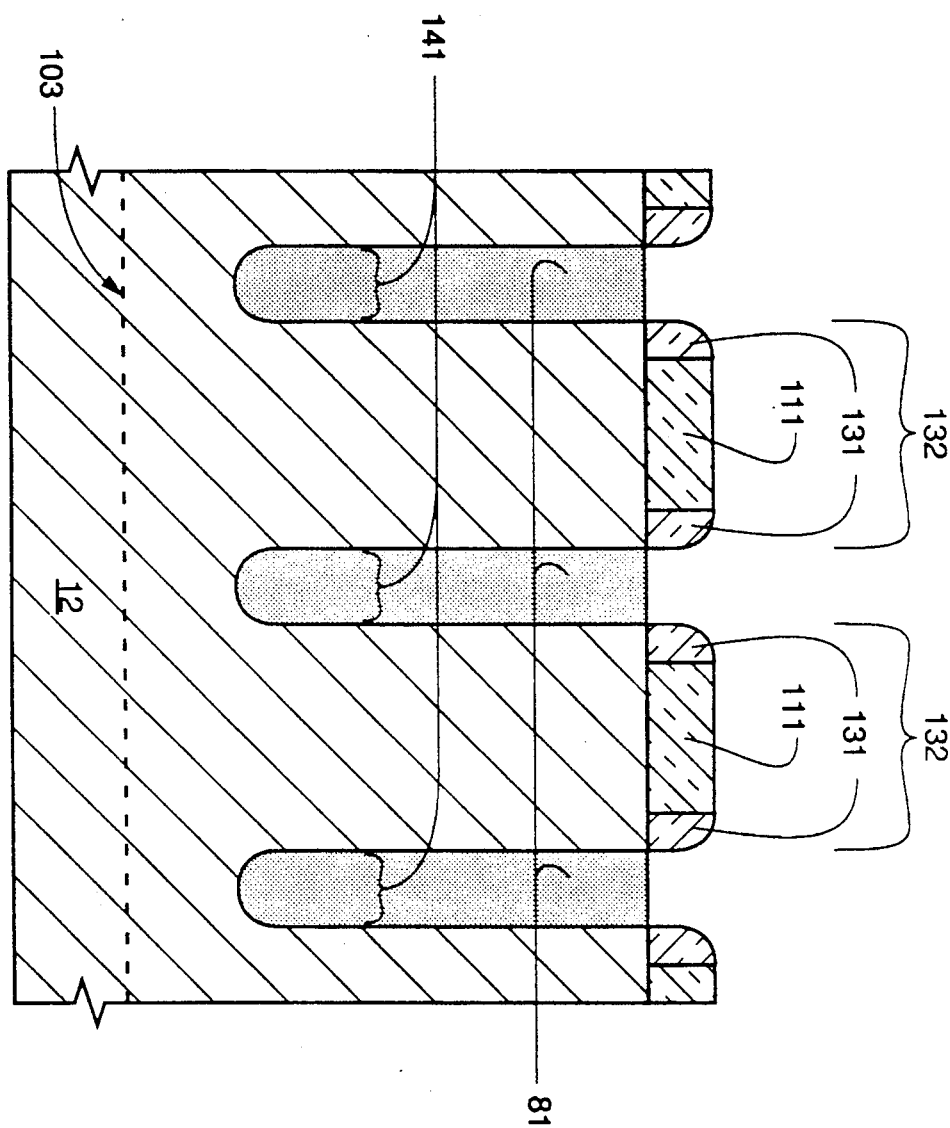
FIG. 14B is a cross-sectional view of the array of FIG. 14A through broken line B—B.

Referring now to FIG. 14A, with storage-trench etching mask 132 in place, a matrix of storage trenches 141 has been etched into the substrate using an anisotropic etch. Storage-trench etching mask 132 has defined storage-trench dimensions in a direction perpendicular to isolation trenches 71, while the trench-filling silicon dioxide 81 within isolation trenches 71 has defined storage-trench dimensions in a direction parallel to isolation trenches 71. Consequently, two oppositely-facing walls of each storage trench will be trench-filling silicon dioxide 81, while the remaining two walls will be substrate 12. FIG. 14B provides a cross-sectional view of the storage node trenches, and FIG. 14C provides an isometric view of the array.

Figure 15:
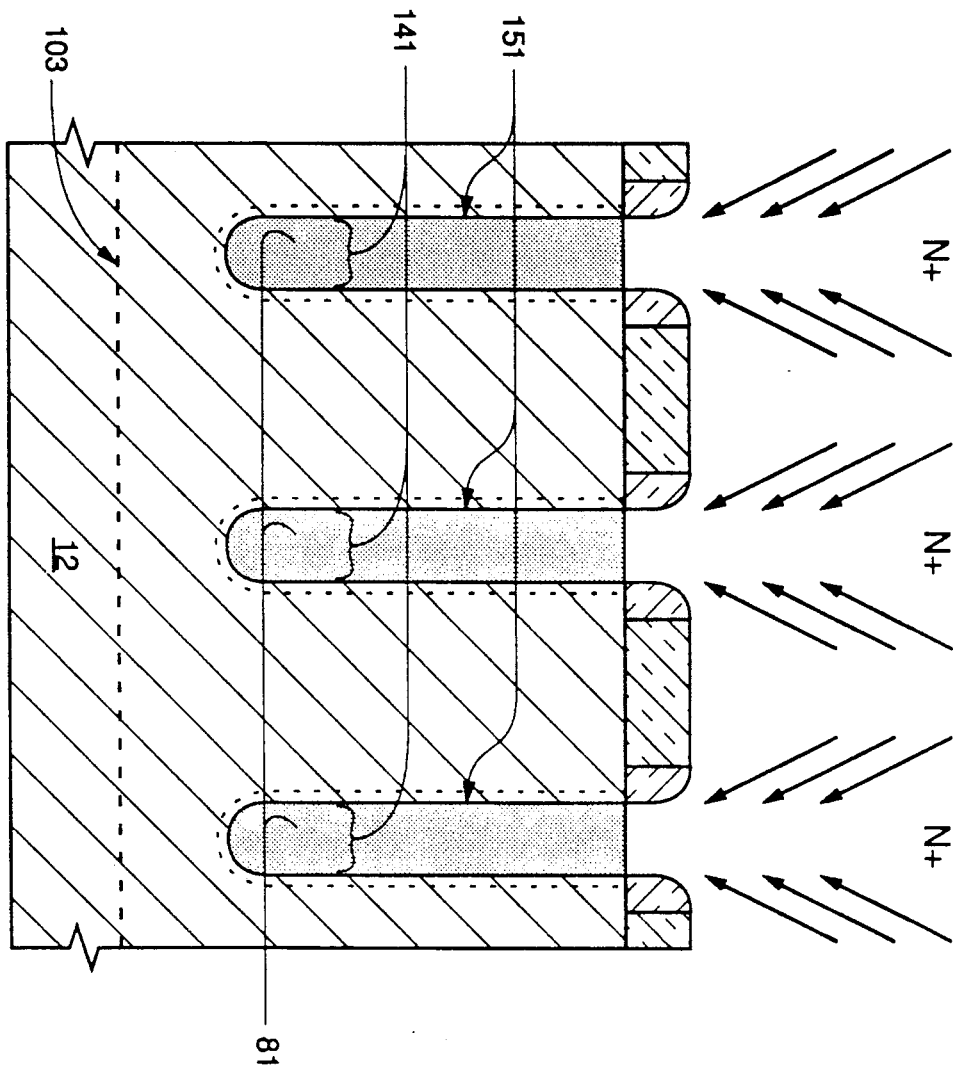
FIG. 15 is a cross-sectional view of the array portion of FIG. 14B following an angled N+ implant.

Referring now to FIG. 15, the array is subjected to an N-type implant, said implant being angled such that it impinges on and penetrates the substantially vertical substrate walls 151 of storage trenches 141 that are perpendicular to the walls of isolation trenches 71. An optional elevated-temperature step is then utilized to drive the implant more deeply into the vertical walls 151.

Figure 16:
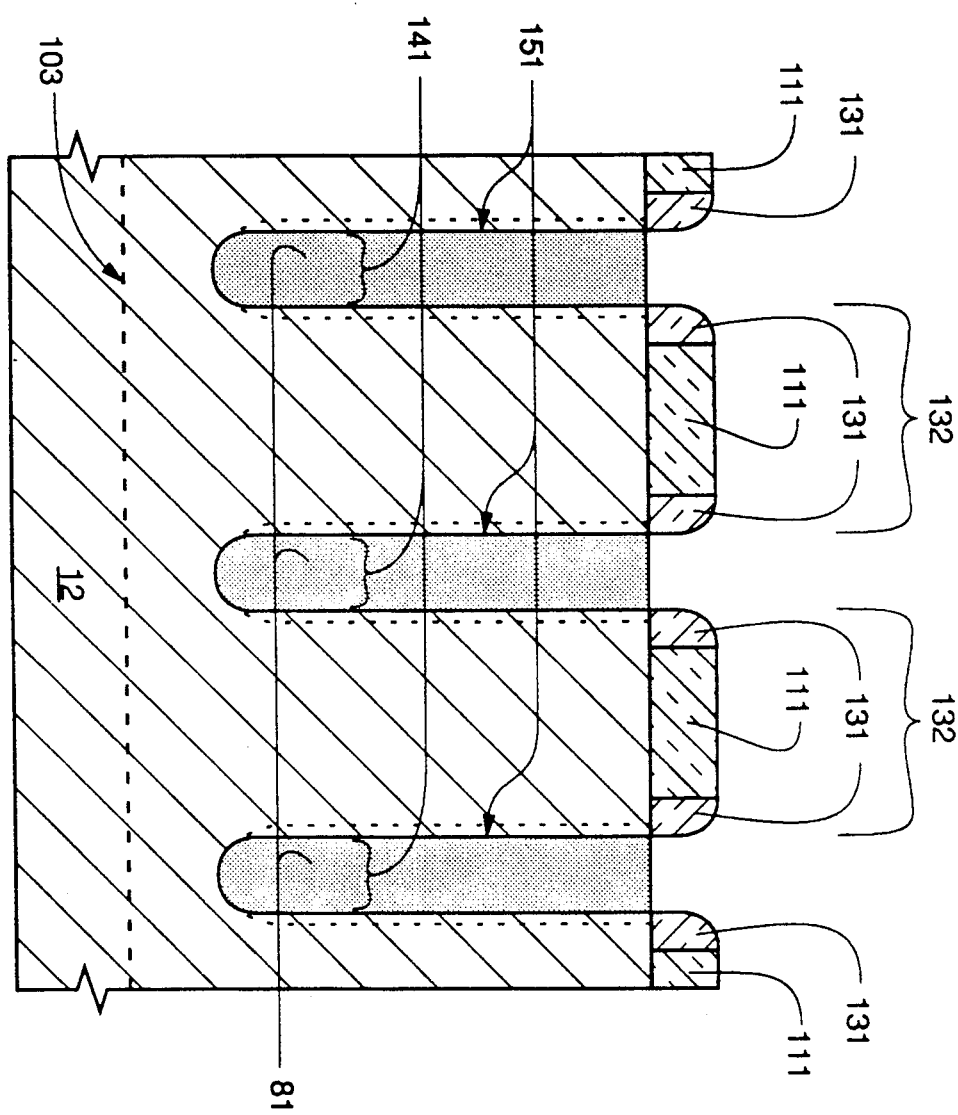
FIG. 16 is a cross-sectional view of the array portion of FIG. 15 following another anisotropic etch.

Referring now to FIG. 16, another anisotropic etch has deepened storage trenches 141.

Figure 17:
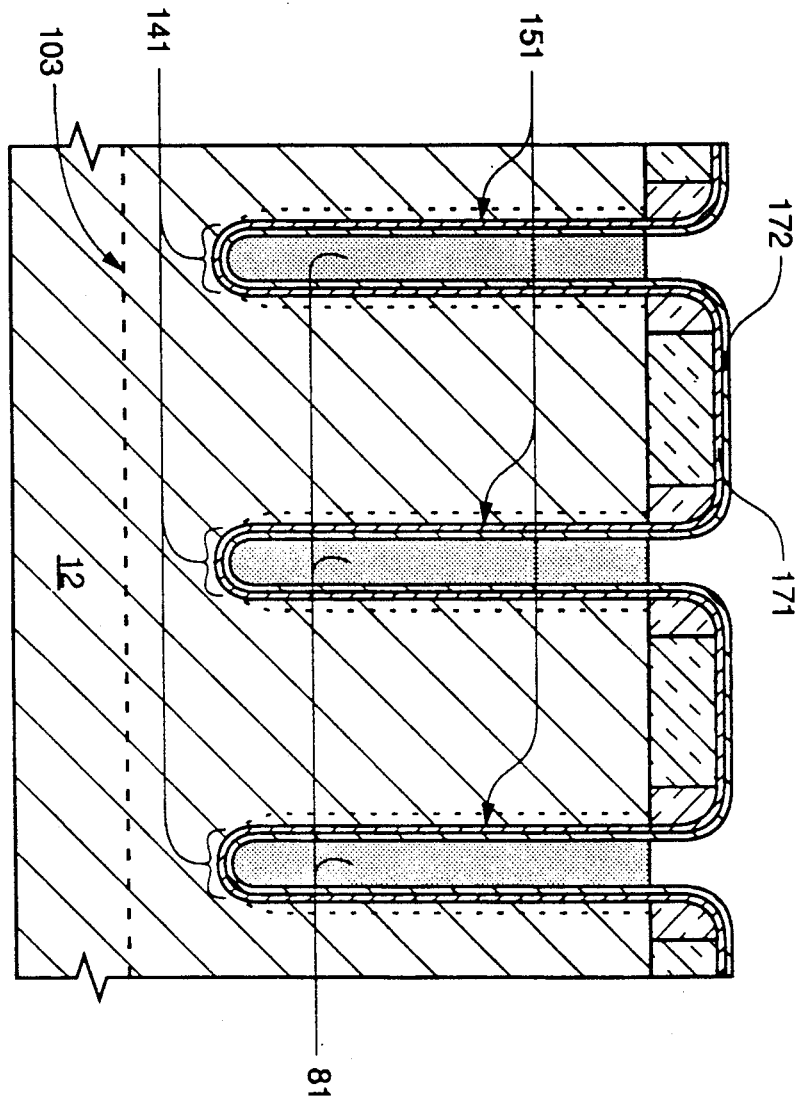
FIG. 17 is a cross-sectional view of the array portion of FIG. 16 following the chemical vapor deposition of a capacitor dielectric material layer such as silicon nitride, a thermal oxidation, step, and the deposition of a conformal thin protective polysilicon layer.

Referring now to FIG. 17, a silicon nitride capacitor dielectric layer 171 has been blanket conformally deposited over the array surface, followed by a thermal oxidation step which fills in any imperfections in nitride layer 171. A conformal deposition of a thin protective polysilicon layer 172 follows.

Figure 18:
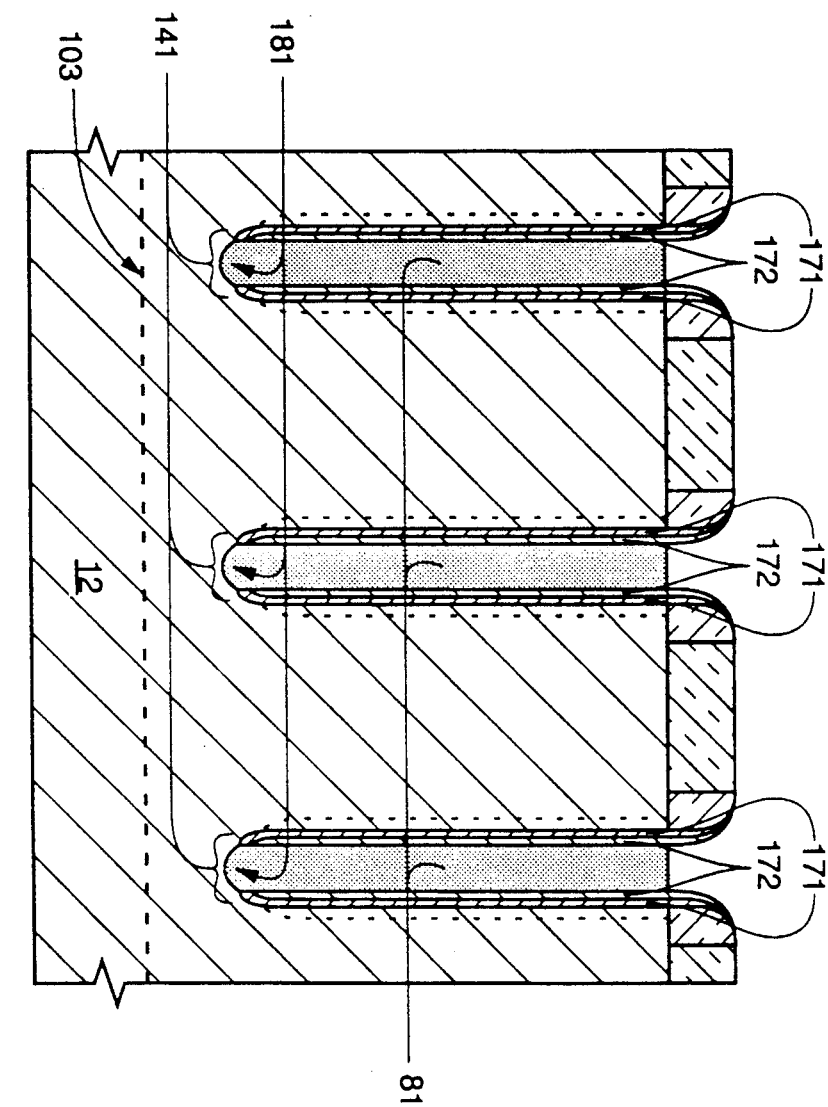
FIG. 18 is a cross-sectional view of the array portion of FIG. 17 following an anisotropic plasma etch which clears the storage trench bottoms of capacitor dielectric and protective polysilicon.

Referring now to FIG. 18, the array has been subjected to a further anisotropic etch that has etched through both protective polysilicon layer 172 and nitride dielectric layer 171 at the bottom of each storage trench 141, creating perforations 181. Protective polysilicon layer 172 protects nitride layer 171 from any disruptive etch during the anisotropic etch. Additionally, portions of protective layer 172 and dielectric layer 171 have been removed on top of the storage-trench etching mask 132. The perforation 181 through to substrate 12 at the bottom of each storage trench 141 provides a grounding path for a polysilicon cell plate that will fill each storage trench 141.

Figure 19:
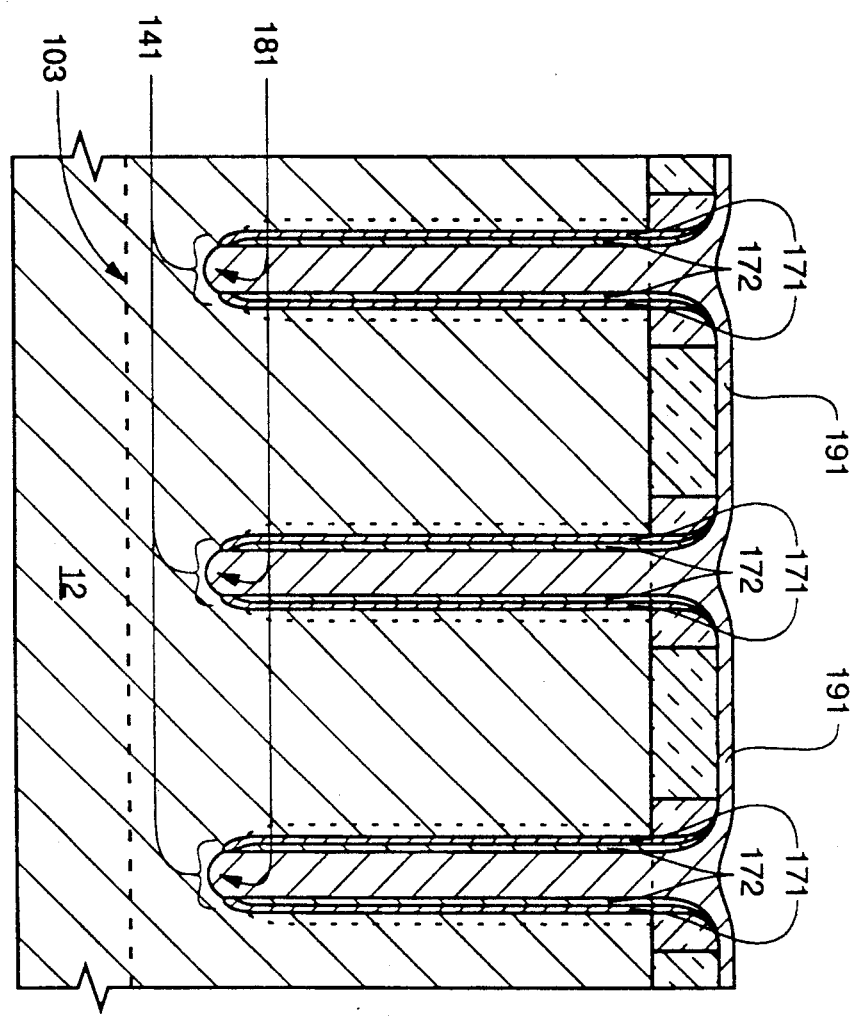
FIG. 19 is a cross-sectional view of the array portion of FIG. 18 following the deposition of a P-type, in-situ doped polysilicon layer which completely fills the storage trenches.

Referring now to FIG. 19, a layer of P-type, in-situ-doped polysilicon 191 is conformally deposited over the surface of the array to a thickness sufficient to effect a complete filling of each storage trench. Within each storage trench 141, the in-situ-doped polysilicon 191 makes electrical contact with the substrate 12 through the perforation 181. P-type polysilicon is utilized for storage trench fill to allow ohmic contact between the fill (which will function as the cell plate) and the substrate 12.

Figure 20A:
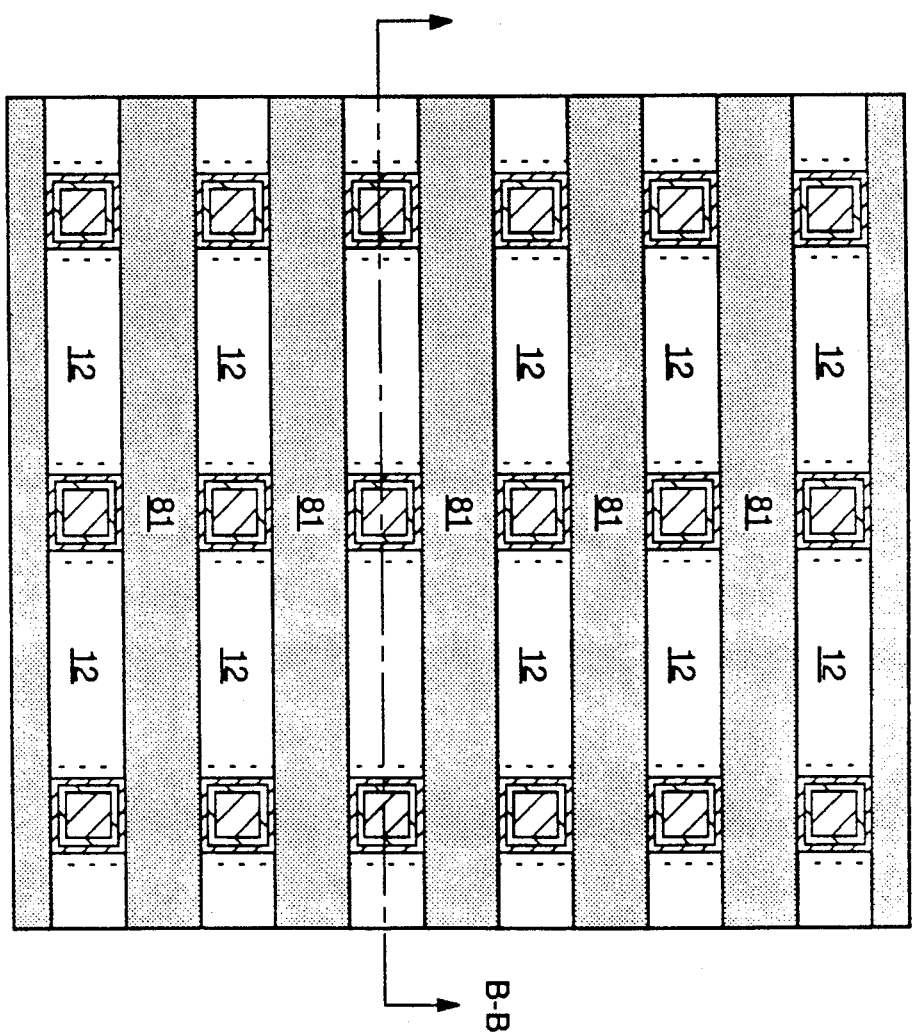
FIG. 20A is a top plan view of the array, a portion of which is depicted in FIG. 19, following planarization of the upper surface down to the substrate level.
Figure 20B:
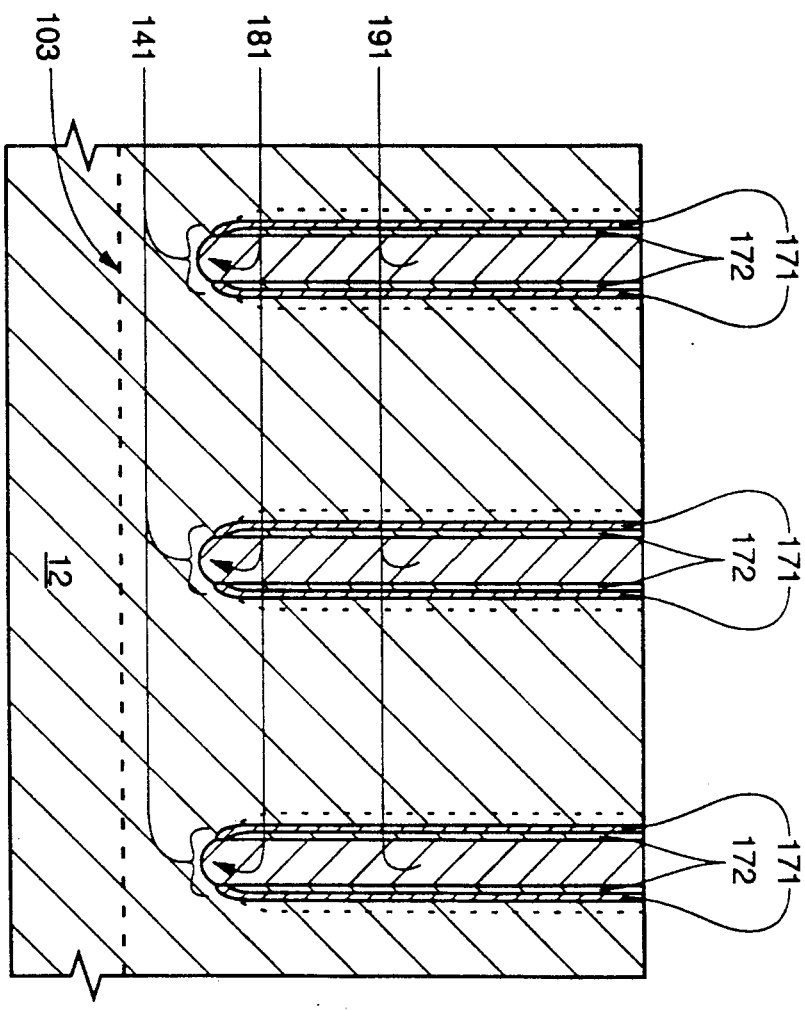
FIG. 20B is a cross-sectional view of the array of FIG. 20A, taken through broken line B—B.
Figure 20C:
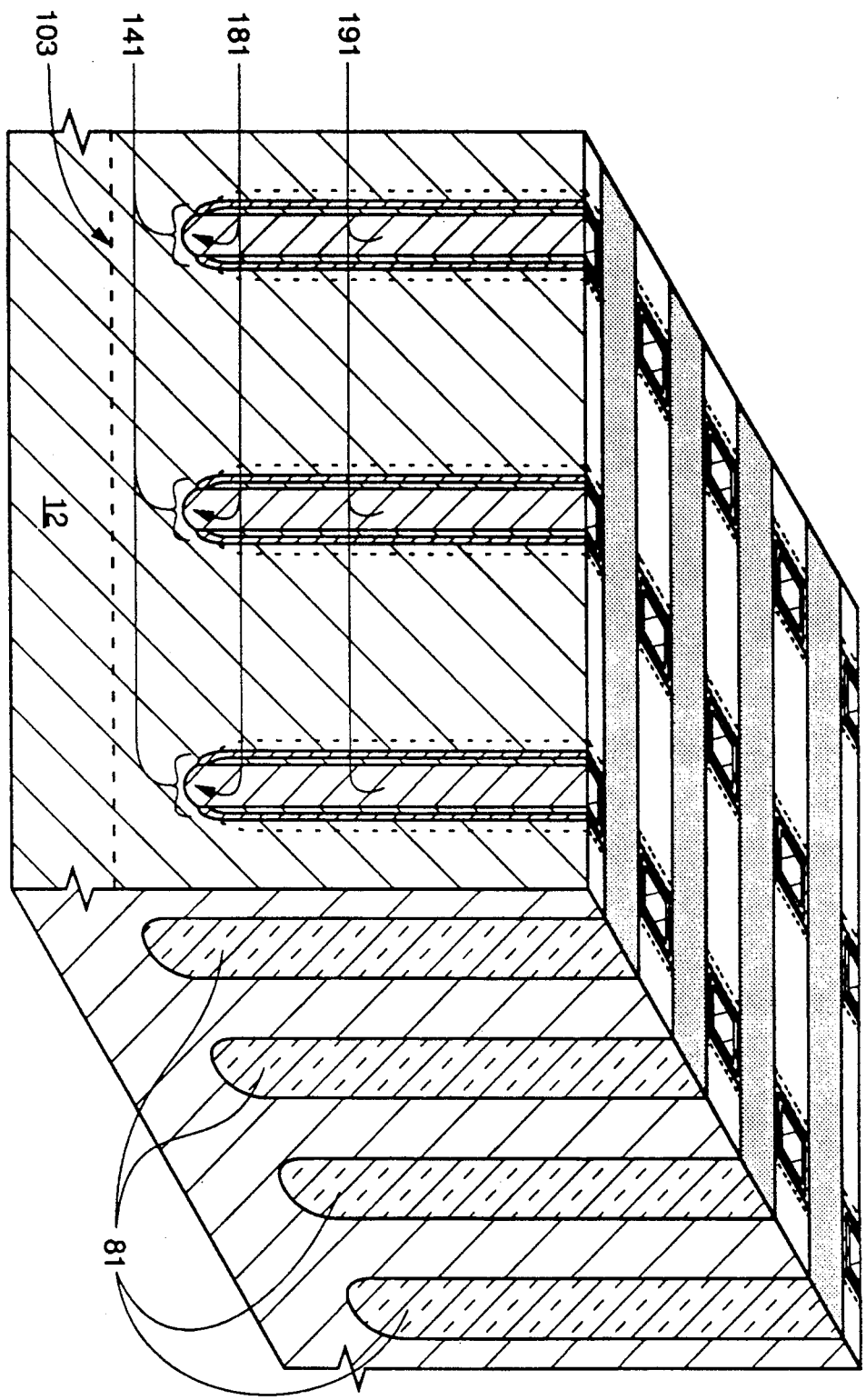
FIG. 20C is an isometric view of the array portion of FIG. 20B.

Referring now to top plan view of the array of FIG. 20A, the array is planarized back to the level of substrate 12, thus removing storage-trench-etching mask 132. FIG. 20B provides a cross-sectional view of the planarized array through broken line B—B, while FIG. 20C provides an isometric view.

The third stage in the fabrication of the DRAM array is the creation of a transistor on opposite sides of each storage trench to provide gated access for the pair of capacitors that have been created within each storage trench 141.

Figure 21:
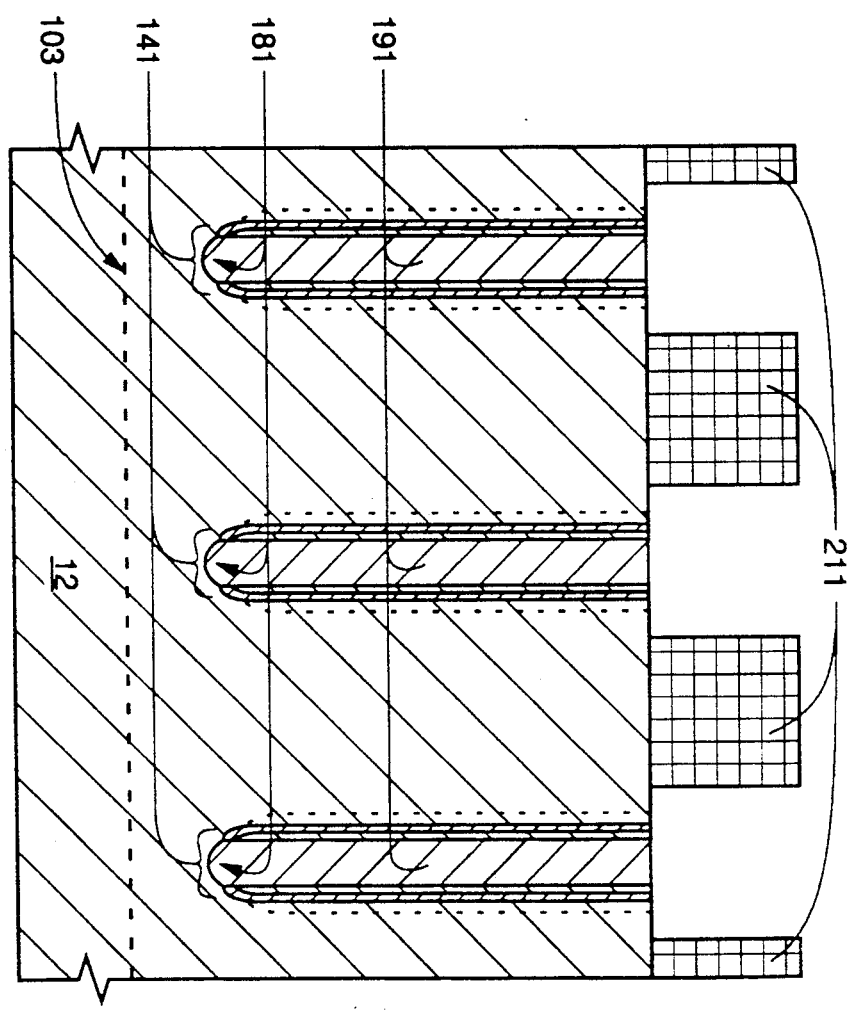
FIG. 21 is a cross-sectional view of the array portion of FIG. 20B following the masking thereof with a third photomask consisting of a third series of photoresist strips applied perpendicularly to the direction of said first series of photoresist strips and parallel to the direction of said second series of photoresist strips (relative to the surface of the substrate), and created using the maximum resolution of the photolithographic process, each of said third series of photoresist strips having substantially identical width, and separated by gaps having a width substantially equal to the photoresist strip width.

Referring now to FIG. 21, the array is masked with a third array-patterning photomask consisting of a third series of parallel photoresist strips 211 applied perpendicular to the direction of said first series of photoresist strips 13 and parallel to the direction of said second series of photoresist strips 102 (relative to the surface of the substrate), and created using the maximum resolution of the photolithographic process, said strips having substantially identical width, and separated by gaps having a width substantially equal to the width of the photoresist strips.

Figure 22:
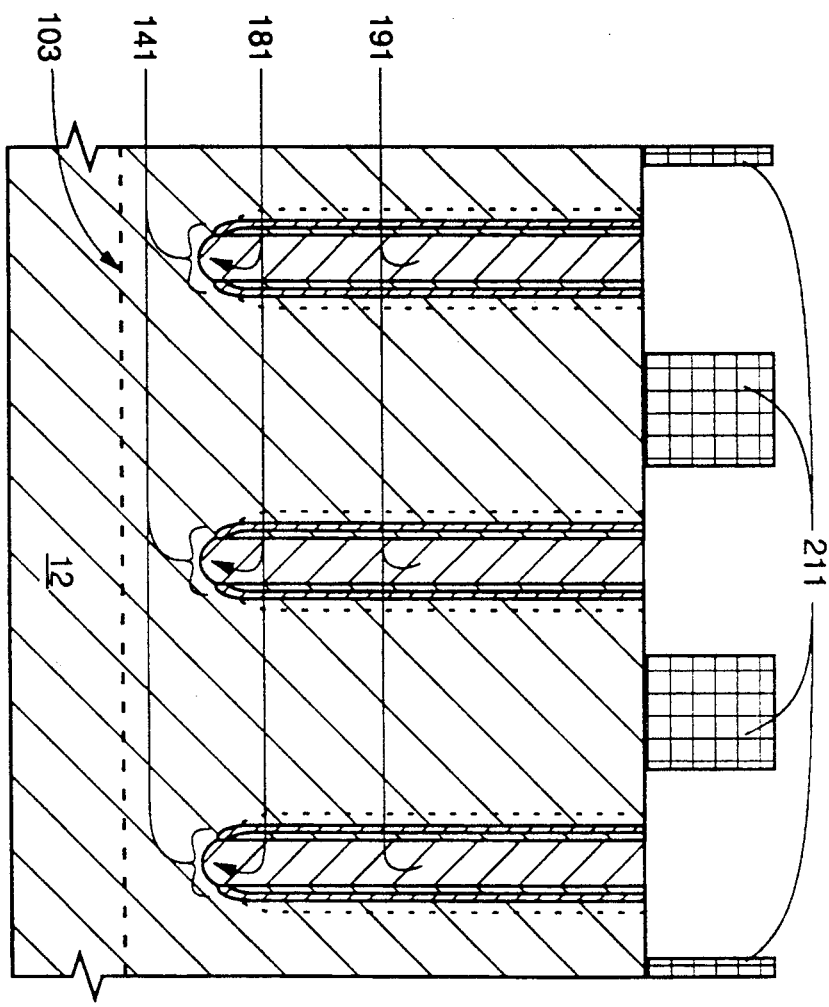
FIG. 22 is a cross-sectional view of the array portion of FIG. 21 following an oxygen plasma etch step, which reduces the height and width of each of the photoresist strips of said third series to approximately three-fourths their original width.

Referring now to FIG. 22, the third series of photoresist strips 211 is subjected to an isotropic oxygen plasma etch, which reduces the height and width of each of the photoresist strips of said third series to approximately three-fourths their original width (approximately ¾F).

Figure 23:
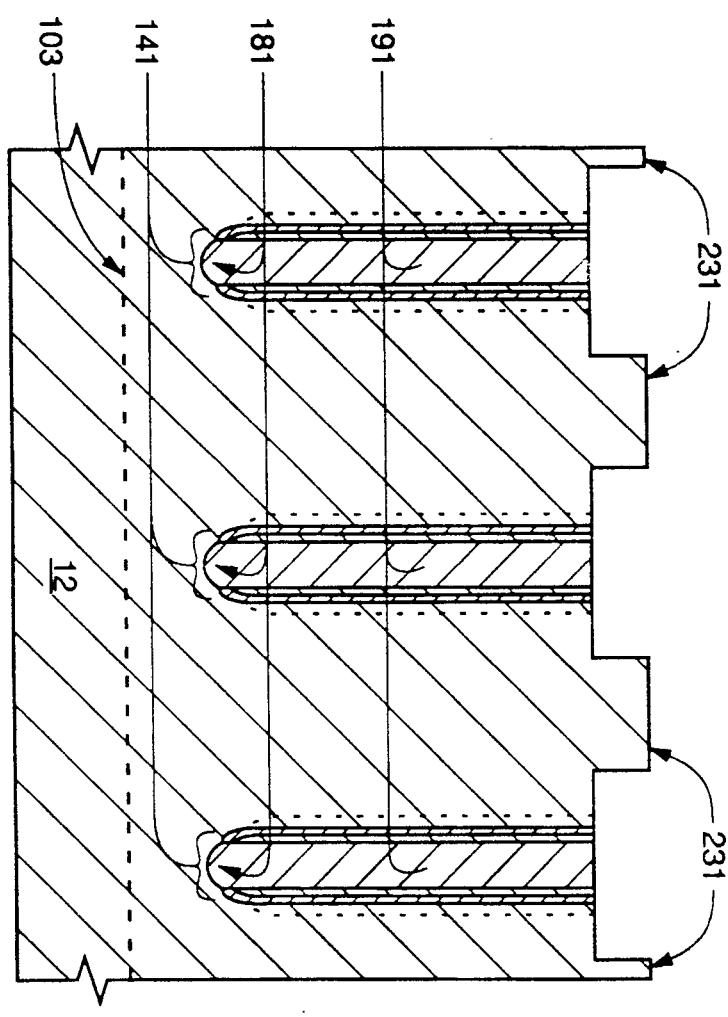
FIG. 23 is a cross-sectional view of the array portion of FIG. 22 following anisotropic etches of both silicon and oxide to create a series of parallel wordline mesas and a photoresist strip.

Referring now to FIG. 23, the array is subjected to an anisotropic etch that is substantially equally selective for both silicon and silicon dioxide. Alternatively, separate etches may be performed consecutively (i.e., one selective for silicon; the other for silicon dioxide). The anisotropic etch(s) creates a series of parallel wordline mesas 231. Wordline mesas 231 are formed from alternating segments of both substrate 12 and trench-filling silicon dioxide 81. Mesa height can be adjusted to increase or increase the channel length of cell access transistors that will soon be created. The third series of photoresist strips 211 is then stripped.

Figure 24:
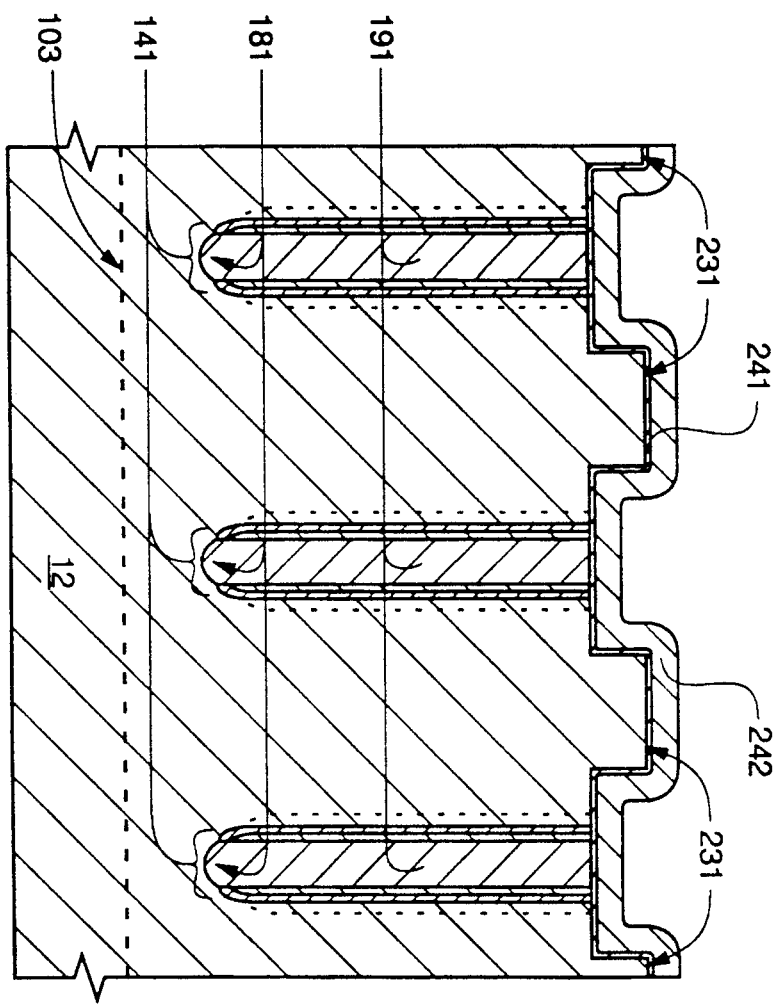
FIG. 24 is a cross-sectional view of the array portion of FIG. 23 following thermal growth of a gate oxide layer and the conformal deposition of a polysilicon gate/wordline layer.

Referring now to FIG. 24, a gate oxide layer 241 is then thermally grown on all exposed silicon surfaces, following which a polysilicon wordline layer 242, approximately equal to 1/6F in thickness, is conformally deposited through chemical vapor deposition over the entire array.

Figure 25:
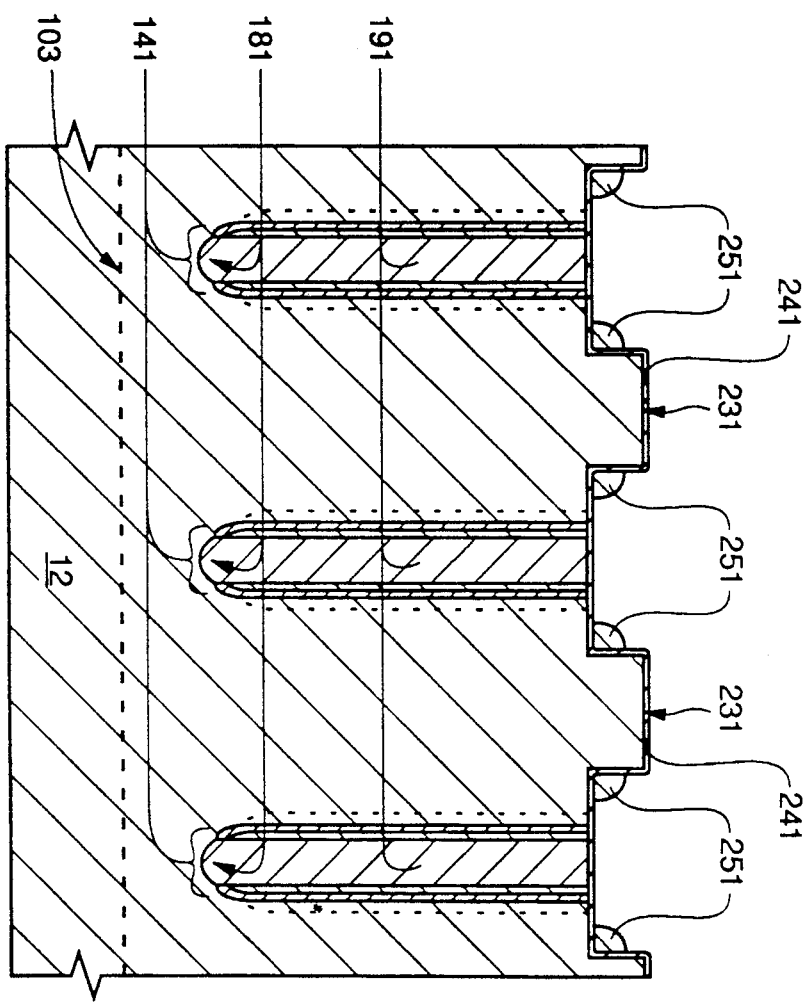
FIG. 25 is a cross-sectional view of the array portion of FIG. 24 following an anisotropic etch of the polysilicon gate/wordline layer.

Referring now to FIG. 25, an anisotropic etch of polysilicon wordline layer 242 has created wordline stringers 251 on the vertical sidewall of each wordline mesa 231. Wherever a wordline stringer 251 crosses over silicon, a field-effect transistor gate 252 is formed.

Figure 26:
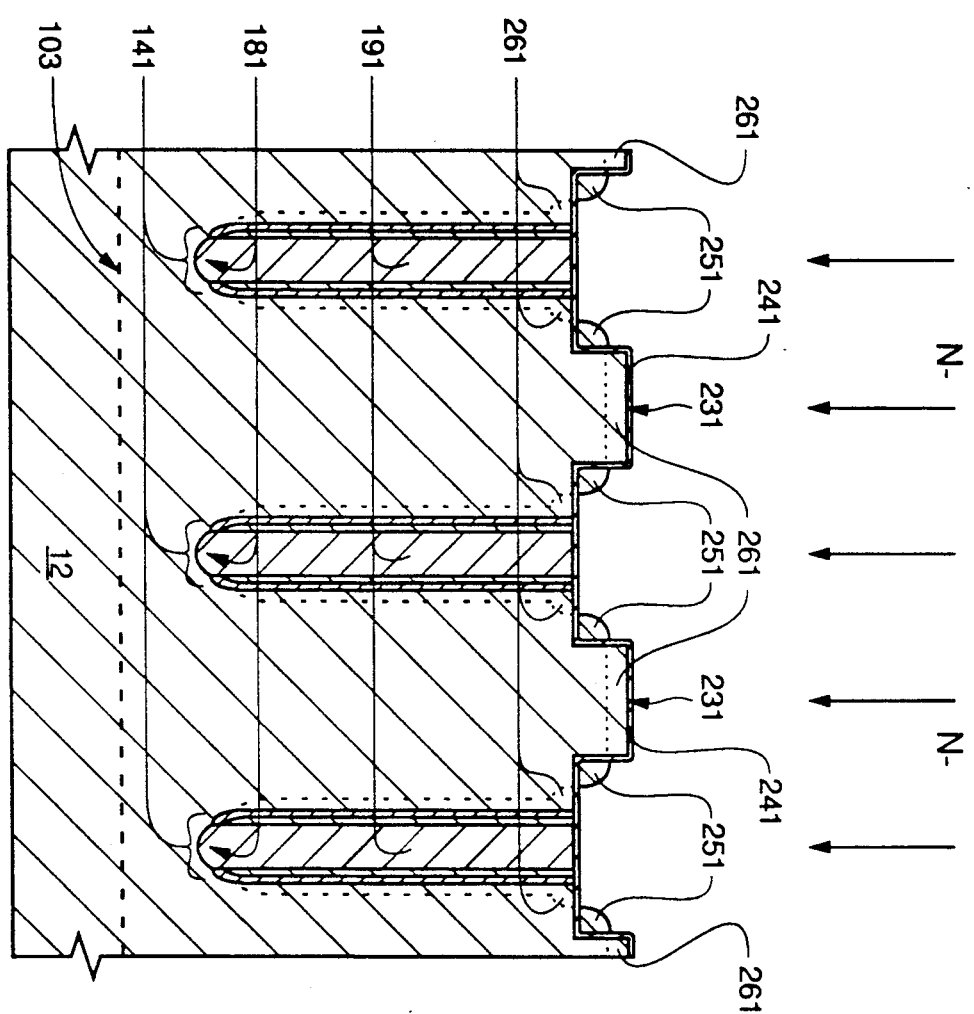
FIG. 26 is a cross-sectional view of the array portion of FIG. 25 following an N-type source/drain implant.

Referring now to FIG. 26, an N-type implant creates source/drain regions 261 for each field-effect transistor gate 252.

Figure 27A:
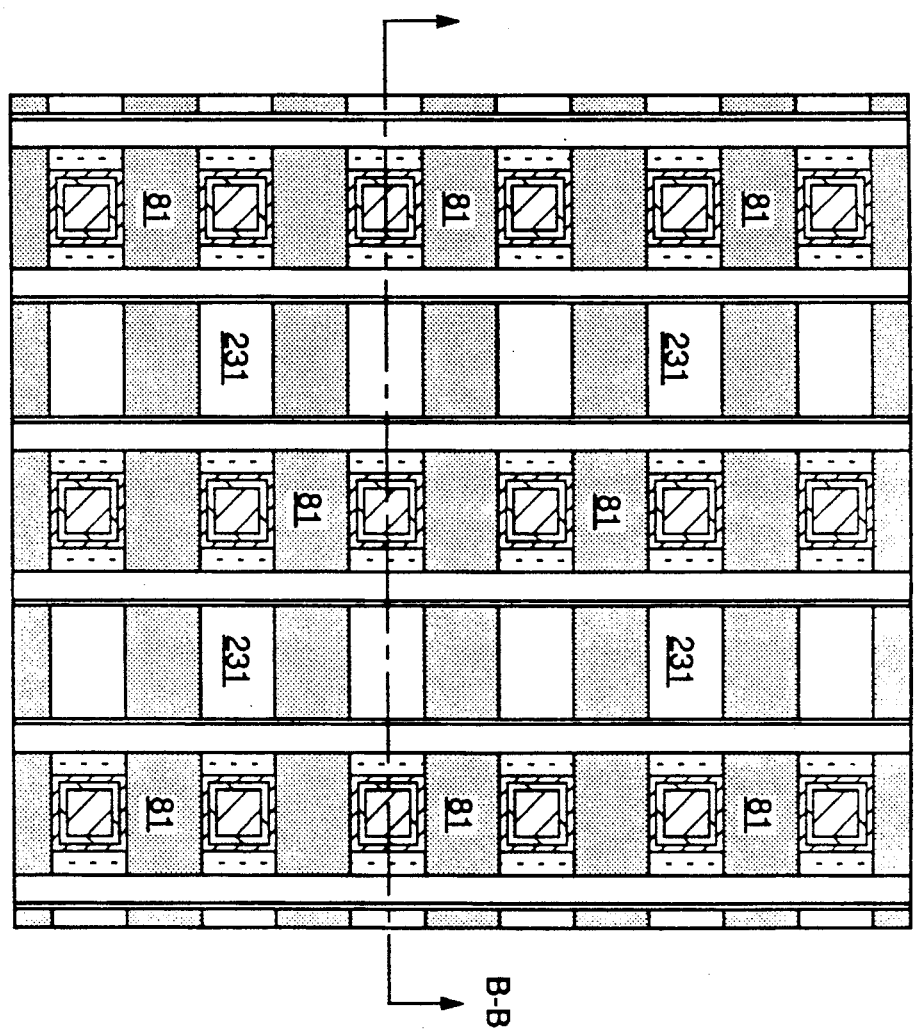
FIG. 27A is a top plan view of the array, a portion of which is depicted in FIG. 26, following self-aligned silicidation of the wordlines.
Figure 27B:
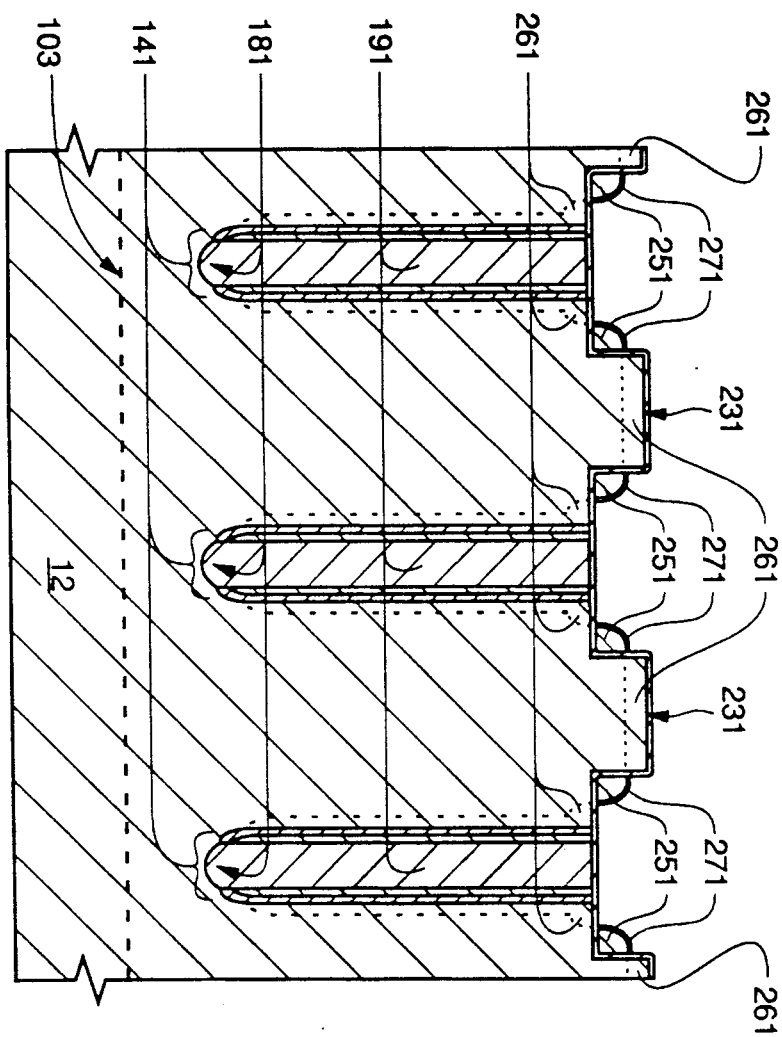
FIG. 27B is a cross-sectional view of a portion of the array of FIG. 27A, taken through broken line B—B.

Referring now to FIG. 27A, the array is subjected to an optional self-aligned silicidation step. Using one well-known method, titanium metal is sputtered on the array, then annealed in a nitrogen ambient. Titanium nitride, a byproduct of the annealing process, is then etched away. A self-aligned titanium silicide layer 271 remains on the exposed surfaces of each wordline stringer 251. The cross-sectional view of FIG. 27B more clearly depicts the titanium-silicided wordline stringers 251.

The fourth stage in the fabrication of the DRAM array is the creation of bitlines for the array.

Figure 28:
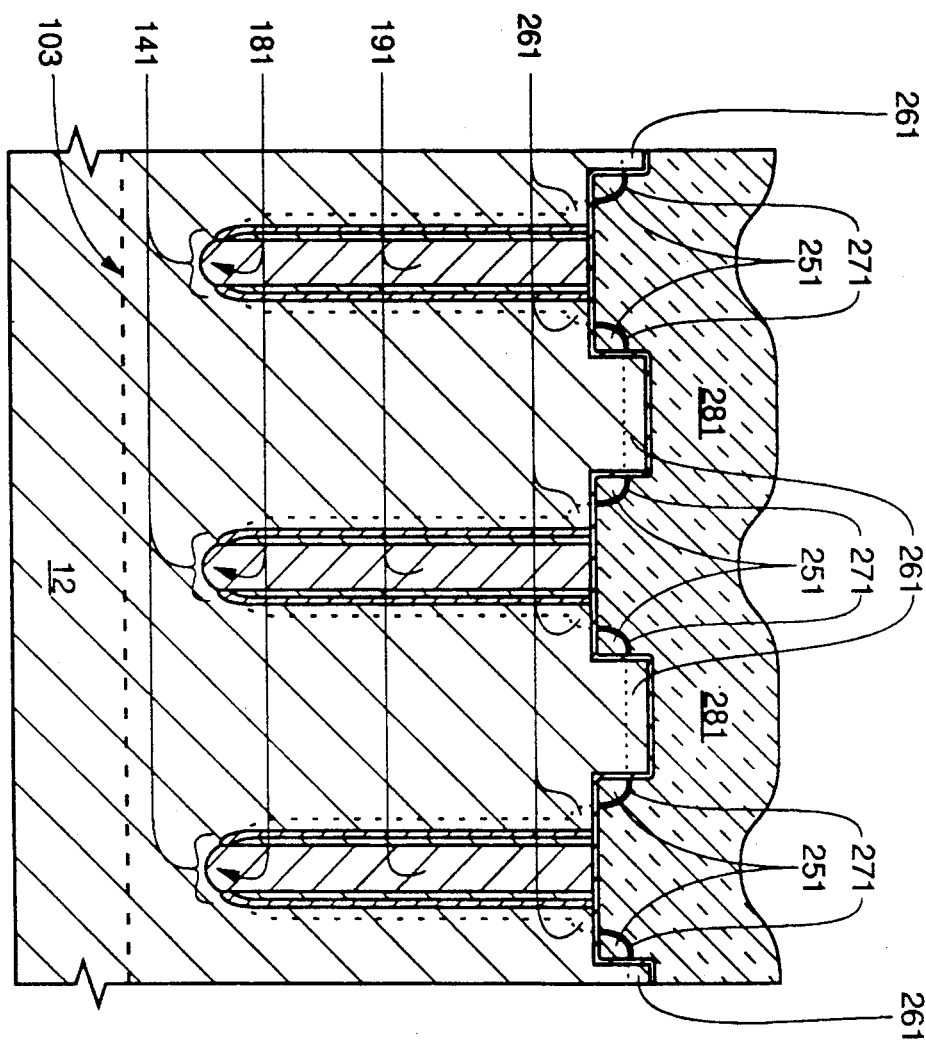
FIG. 28 is a cross-sectional view of the array portion of FIG. 27A following the conformal deposition of an insulative separation layer (silicon dioxide is used for the description of the preferred embodiment of the process)

Referring now to FIG. 28, a silicon dioxide separation layer 281 having a thickness approximately equal to 1F is conformally deposited over the surface of the array.

Figure 29C:
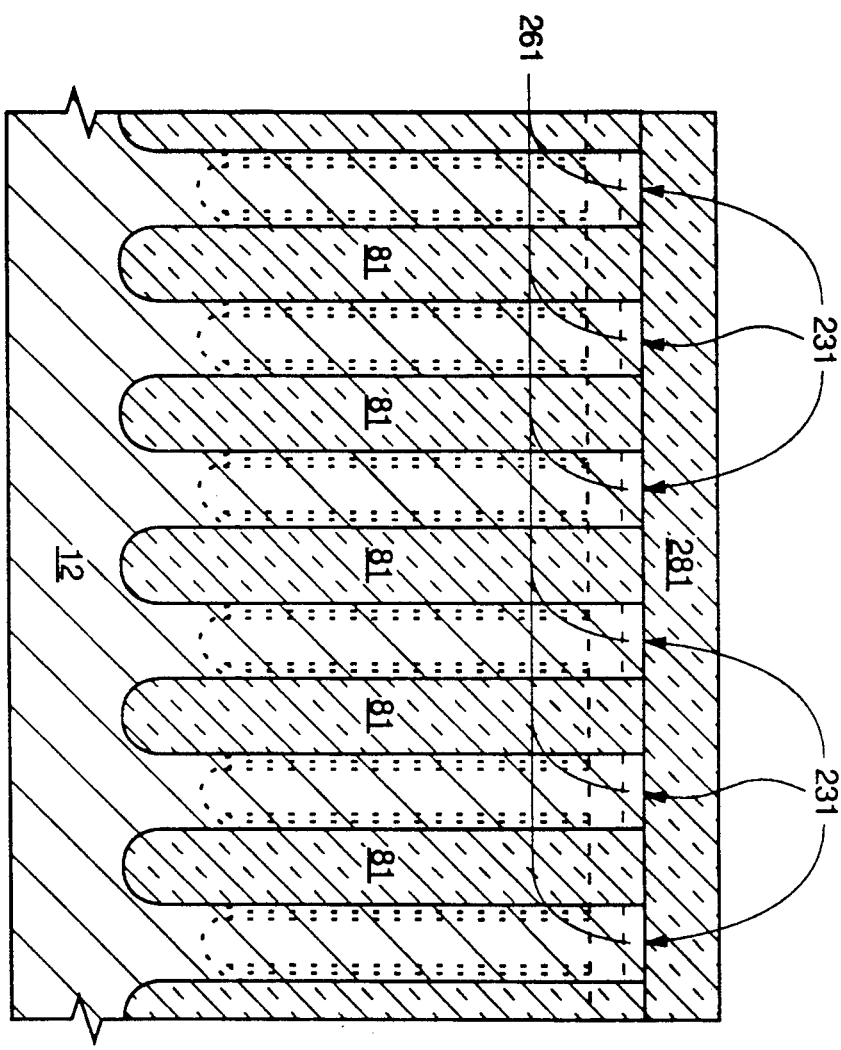
FIG. 29C is a cross-sectional view of a portion of the array of FIG. 29A, taken through broken line C—C.

Referring now to the top plan view of the array in FIG. 29A, separation layer 281 has been planarized in order to reduce its thickness on top of the wordline mesas 231 to approximately ½F. The planarization can be seen in FIG. 29B, which is a cross-sectional view taken through broken line B—B of FIG. 29A. FIG. 29C is a cross-sectional view at the same process stage taken through broken line C—C of FIG. 29A.

Figure 30:
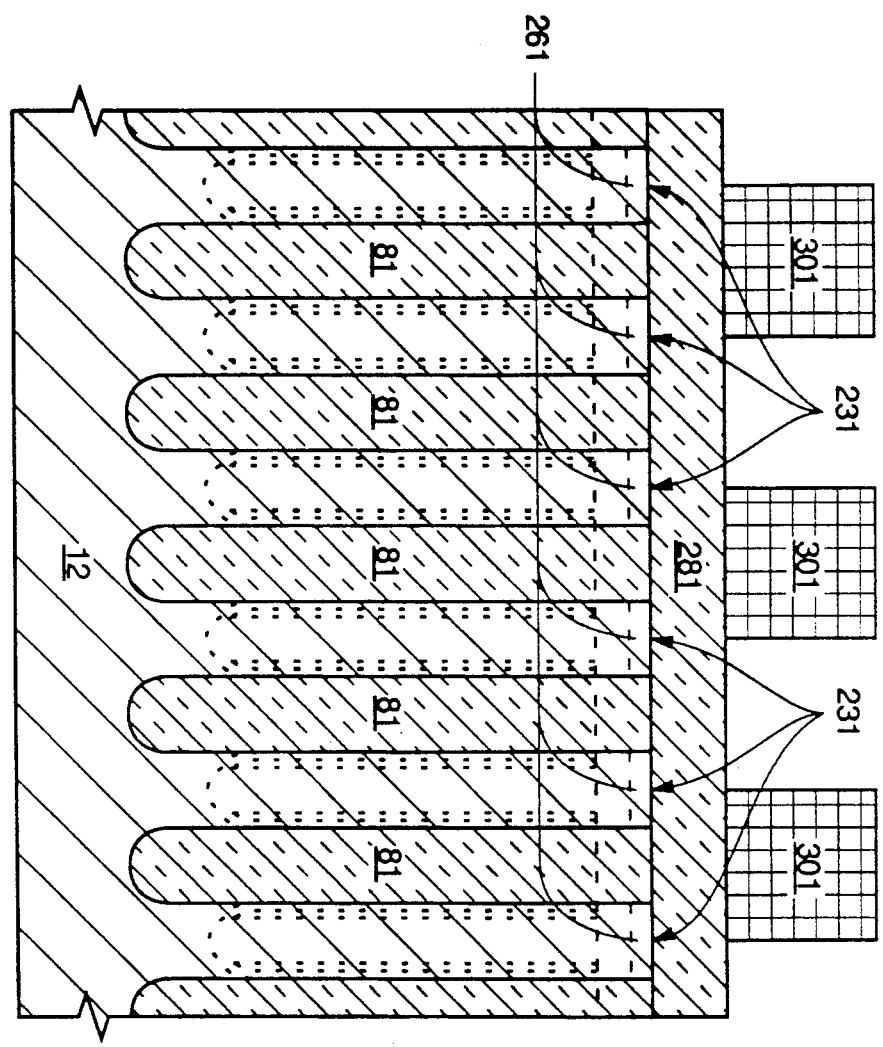
FIG. 30 is a cross-sectional view of the array portion of FIG. 29C, following the masking of the planarized separation layer with a fourth photomask consisting of a fourth series of photoresist strips applied perpendicularly to the direction of said third series of photoresist strips (relative to the surface of the substrate), and created using the maximum resolution of the photolithographic process, said strips having substantially identical width, and separated by gaps having a width substantially equal to photoresist strip width.

Referring now to FIG. 30, planarized silicon dioxide separation layer 281 has been masked with a fourth array-patterning photomask consisting of a fourth series of parallel photoresist strips 301 applied perpendicularly to the direction of said third series of photoresist strips 211 (relative to the surface of the substrate), and created using the maximum resolution of the photolithographic process, said strips having substantially identical width, and separated by gaps having a width substantially equal to the width of the photoresist strips.

Figure 31:
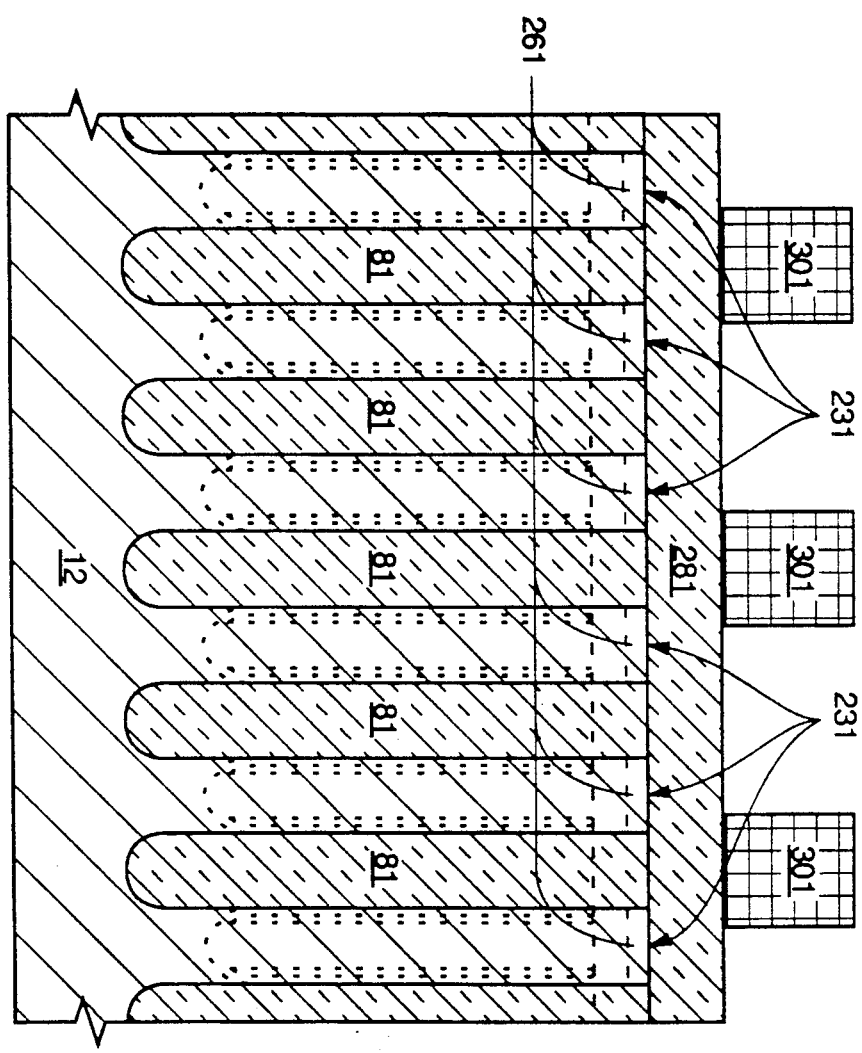
FIG. 31 is a cross-sectional view of the array portion of FIG. 30 following an oxygen plasma etch step, which reduces the height and width of each of the photoresist strips of said fourth series to approximately three-fourths their original width.

Referring now to FIG. 31, the fourth series of photoresist strips 301 is subjected to an isotropic oxygen plasma etch step, which reduces the height and width of each of the photoresist strips of said fourth series to approximately three-fourths their original width.

Figure 32A:
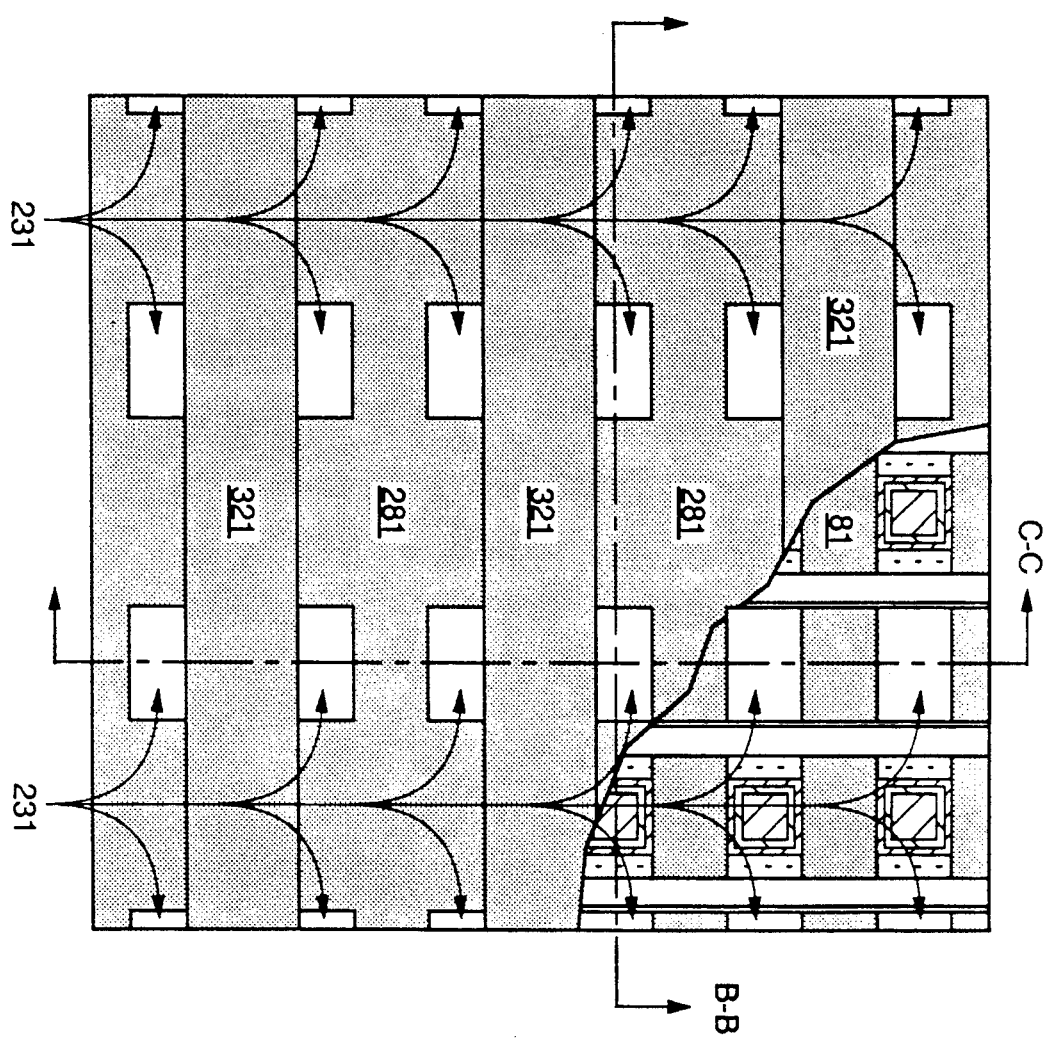
FIG. 32A is a top plan view of the array portion of FIG. 31 following a masked anisotropic etch of the planarized silicon dioxide layer down to the wordline mesa substrate level.
Figure 32B:
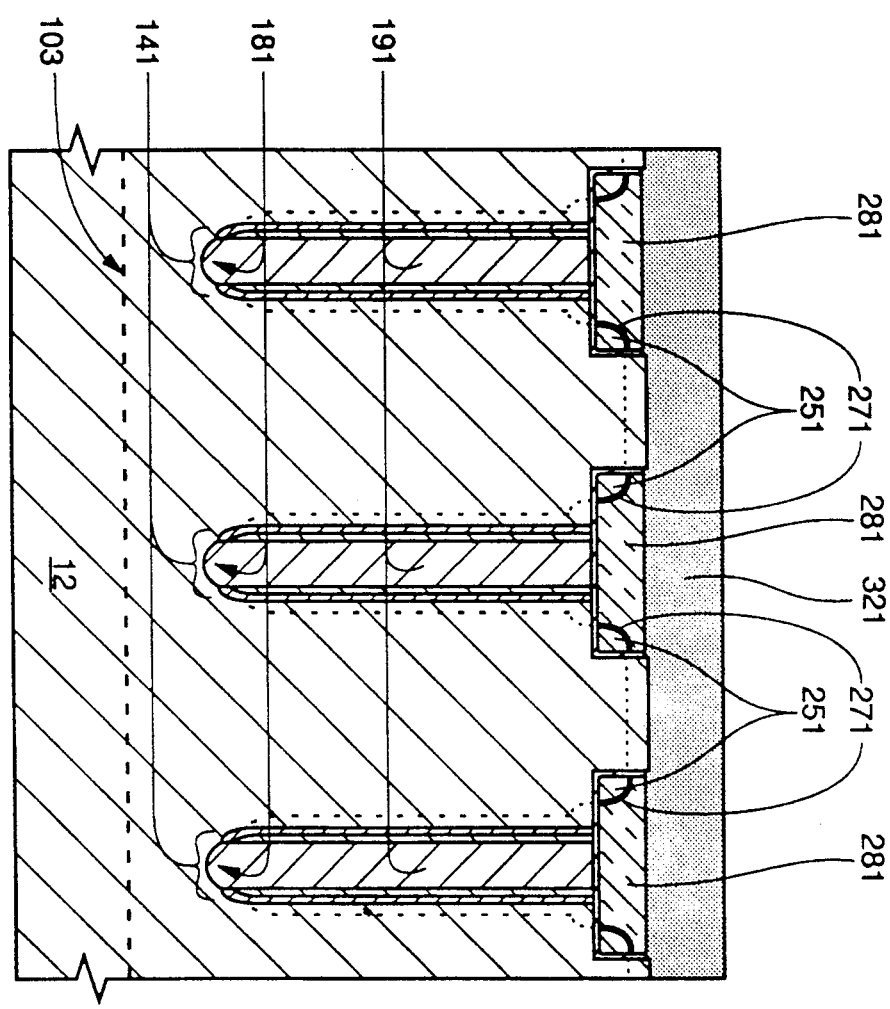
FIG. 32B is a cross-sectional view of a portion of the array of FIG. 32A, taken through broken line B—B.
Figure 32C:
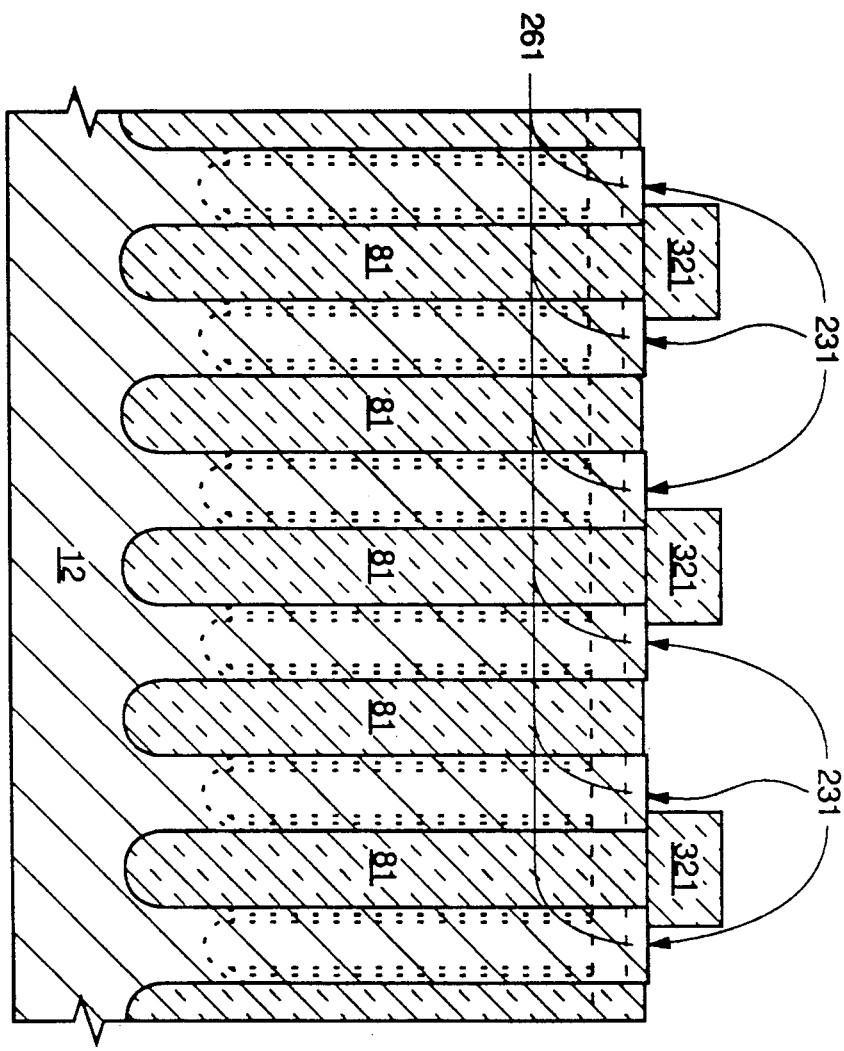
FIG. 32C is a cross-sectional view of a portion of the array of FIG. 32A, taken through broken line C—C.

Referring now to FIG. 32A, planarized silicon dioxide separation layer 281 has been anisotropically etched down to a level that at least clears the tops of wordline mesas 241. The anisotropic etch has created a series of bitline mesas 321. FIG. 32B is a cross-sectional view of the array taken through a row of storage trenches perpendicular to the cross-sectional view of FIG. 32A. It will be noted that the wordline strips 251 are completely covered by silicon dioxide separation layer 281. FIG. 32C is a cross-sectional view of the array taken through broken line C—C of FIG. 32A. The bitline mesas 321 are more clearly visible in FIG. 32C.

Figure 33:
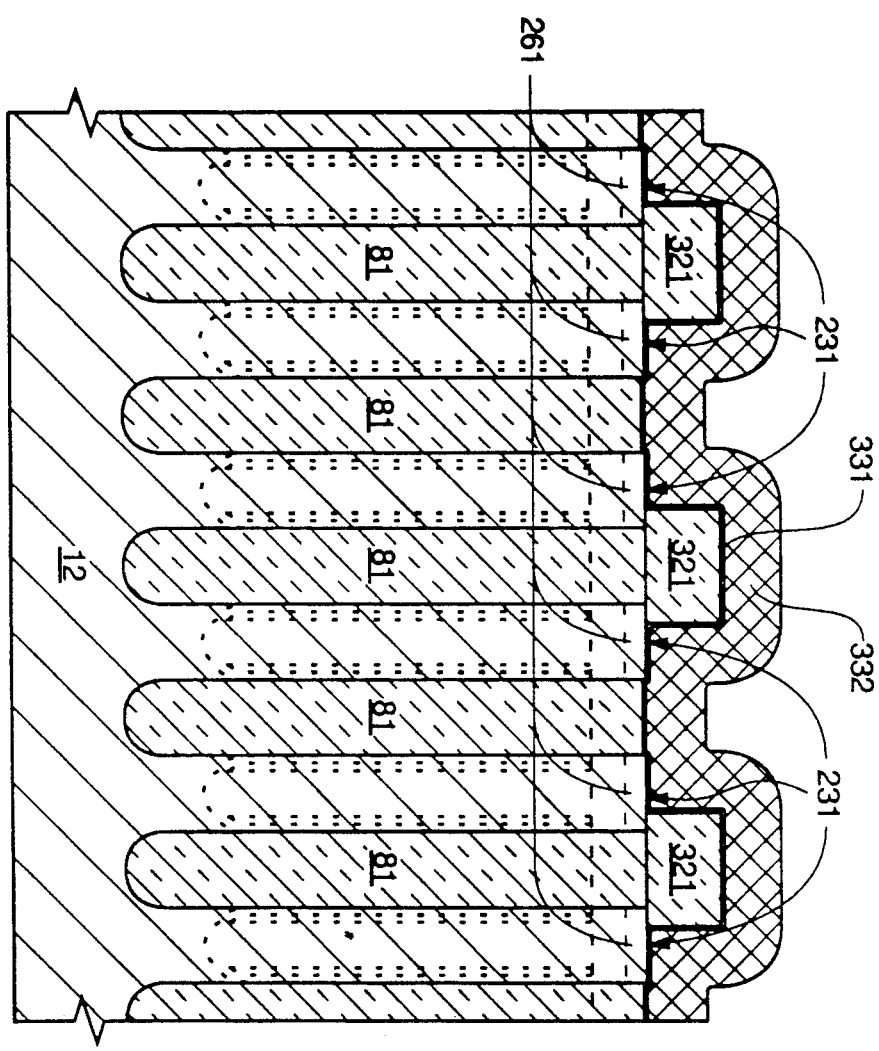
FIG. 33 is a cross-sectional view of the array portion of FIG. 32C following the conformal deposition of an optional thin "glue layer", followed by the deposition of a metal layer (aluminum is used in the description of the preferred embodiment of the process)

Referring now to FIG. 33, a optional "glue layer" 331, such as titanium nitride, has been formed on the array surface by one of various well-known techniques, following which a conformal tungsten metal layer 332 is blanket deposited.

Figure 34B:
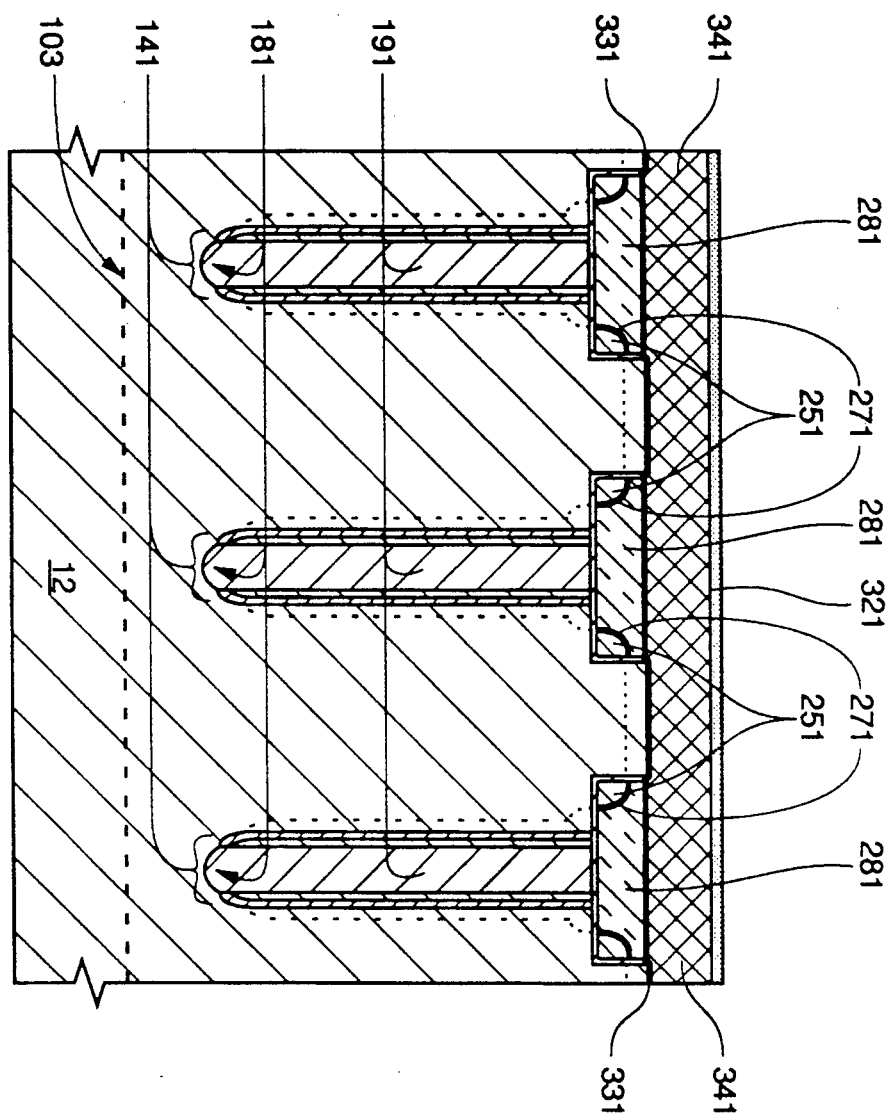
FIG. 34B is a cross-sectional view of the array of FIG. 34A through broken line B—B.
Figure 34C:
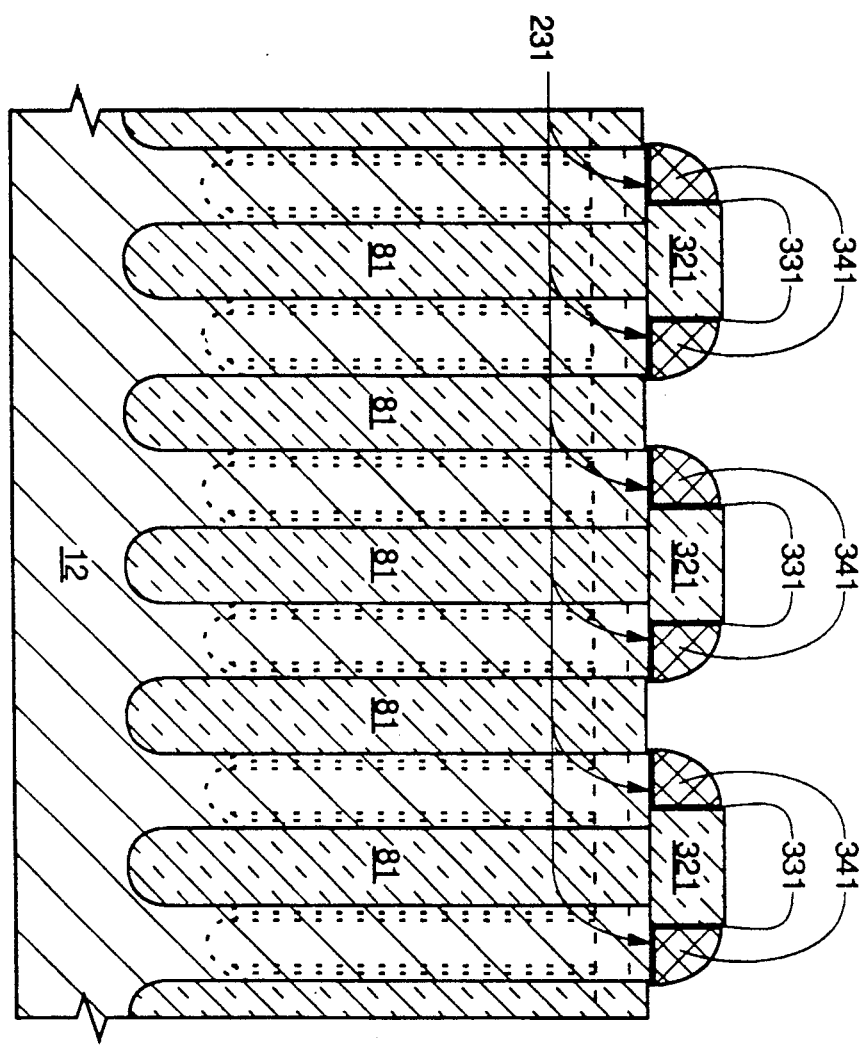
FIG. 34C is a cross-sectional view of the array of FIG. 34A taken through broken line C—C.

Referring now to FIG. 34A, tungsten metal layer 332 has been anisotropically etched to the point that the tops of bitline mesas 321 are exposed, thus creating tungsten bitline stringers 341 on the vertical sidewalls of bitline mesas 321, with regions of exposed trench-filling silicon dioxide 81 between each pair of facing bitline stringers 341. Each bitline stringer 341 makes contact with an N-doped top of a single substrate segment of each wordline mesa 241. FIG. 34B is a cross-sectional view of the array through broken line B—B of FIG. 34A, while FIG. 34C is a cross-sectional view of the array through broken line C—C of FIG. 34A.

Although only a single embodiment of the process for creating a DRAM array having feature widths that transcend the resolution limit of the employed photolithographic process has been disclosed, it will be apparent to those having ordinary skill in the art, that changes may be made thereto without departing from the spirit and the scope of the process as claimed. For example, a PMOS array could be fabricated using a similar sequence, starting with a lightly-doped N-type substrate and reversing the conductivity types of required implants.

What is claimed is:

1. A process for fabricating a dynamic random access memory array on the planarized substrate of a silicon wafer of a first conductivity type, said array having feature widths that transcend the resolution limit of the employed photolithographic process, said process comprising the following steps:

(a) creating a first hard-material mask on the substrate, said first hard-material mask comprising a first series of substantially parallel, hard-material stringers, each of which has both a width of less than F, the minimum feature width of the employed photolithographic process, and also a separation distance, from one or more neighboring stringers in said first series, of less than F;

(b) anisotropically etching the substrate to create a series of substantially parallel isolation trenches in an array region on the wafer;

(c) filling the isolation trenches with insulative material;

(d) replanarizing the wafer back to the substrate level;

(e) creating a second hard-material etch mask on top of the array region comprising a series of substantially parallel, hard-material masking strips with substantially vertical longitudinal edges, each of which is separated from one or more neighboring masking strips, by gaps which are less than or equal to F, said masking strips being substantially perpendicular to said first series of hard-material masking stringers;

(f) etching a matrix of storage trenches in the substrate with an anisotropic etch that is selective for silicon over the insulative material used to fill the isolation trenches, said storage trenches having a pair of substantially vertical, opposing silicon walls and a pair of substantially vertical, opposing insulative-material walls, and said storage trenches being substantially less deep than said isolation trenches;

(g) angled implantation of an impurity which creates junctions of a second conductivity type on the silicon walls of said storage trenches;

(h) deepening said storage trenches with a further anisotropic etch that is selective for silicon over the insulative material, said storage trenches remaining substantially less deep than said isolation trenches;

(i) depositing a dielectric layer on the walls of said storage trenches;

(j) removal of the dielectric layer at the bottom of each storage trench;

(k) filling the storage trenches with polysilicon that is in-situ doped to said first conductivity type;

(l) replanarizing the wafer back to the substrate level;

(m) creating a third series of parallel photoresist strips on the array region, each strip within said third series being substantially perpendicular to the isolation trenches, having a feature width less than or equal to F, and, except at the edges of the array, being substantially centered between a pair of adjacent storage trench rows;

(n) creating a series of wordline mesas having substantially vertical longitudinal edges by anisotropically etching, to substantially equal levels, both silicon and insulative material that is not subjacent one of the photoresist strips of said third series;

(o) stripping said third series of photoresist strips;

(p) creation of a gate oxide layer on top of all exposed silicon;

(q) conformal deposition of a wordline layer;

(r) anisotropically etching said wordline layer to form a wordline stringer on each vertical longitudinal edge of each wordline mesa, the top of each wordline stringer being substantially below wordline mesa height level;

(s) implantation of an impurity which creates source and drain regions of a second conductivity type on exposed silicon surfaces;

(t) deposition of an insulative-material separation layer;

(u) planarizing said separation layer;

(v) masking said separation layer with a fourth series of parallel photoresist strips on the array region, each strip within said fourth series being substantially parallel to the isolation trenches, having a feature width less than or equal to F, and, except at the edges of the array, being substantially centered over an isolation trench and being separated from an adjacent strip within same said series by a gap that is also substantially centered over an isolation trench;

(w) anisotropically etching the separation layer to an extent that the tops of the wordline mesas are cleared, but wordline stringers are not exposed;

(x) deposition of a conformal metal layer; and (y) anisotropically etching said metal layer to form bitline stringers.

2. The process of claim 1, wherein the insulative material used to fill said isolation trenches is silicon dioxide.

3. The process of claim 1, wherein said first hard-material mask further comprises an expanse of hard material which blankets future peripheral regions of the substrate.

4. The process of claim 1, which further comprises the step of depositing a layer of polysilicon on top of said dielectric layer prior to removal of said dielectric layer at the bottom of each of said storage trenches.

5. The process of claim 1, wherein the width of each photoresist strip in said third parallel series and of each photoresist strip in said fourth parallel series is substantially equal to $\frac{3}{4}F$.

6. The process of claim 1 wherein said insulative-material separation layer is silicon dioxide.

7. The process of claim 1 wherein titanium is used to silicide the wordlines in a self-aligned silicidation process.

8. The process of claim 1 wherein said conformal metal layer is tungsten.

9. The process of claim 1, wherein each of the hard-material stringer which comprise said first hard-material mask has a width substantially equal to $\frac{1}{2}F$.

10. The process of claim 9, wherein each of the hard-material stringers which comprise said first hard-material mask is separated from an adjacent stringer by a gap substantially equal to $\frac{1}{2}F$.

11. The process of claim 3 wherein said second hard material mask is created using the following process sequence:

(a) blanket deposition of a second hard-material masking layer on the upper surface of the silicon substrate;

(b) masking the second hard-material masking layer with a second array-patterning photomask consisting of a second series of substantially parallel, substantially equidistantly-spaced photoresist strips applied at greater than half the maximum resolution of the photolithographic process;

(c) anisotropically etching the second hard-material masking layer in order to transfer the pattern of said second series of photoresist strips thereto, thus creating said series of substantially parallel, hard-material masking strips;

(d) stripping said second series of photoresist strips;

(e) blanket deposition of a third hard-material masking layer, said third hard-material masking layer coating the upper surface and vertical sidewalls of each hard-material masking strip, as well as exposed portions of the silicon substrate between each adjacent pair of hard-material masking strips; and (f) anisotropically etching the third hard-material masking layer to the extent that the upper surface of each hard-material masking strip is exposed and one of a second series of hard-material masking stringers is created on each sidewall of each hard-material masking strip.

12. The process of claim 1, wherein said second hard-material mask further comprises one of a second series of hard-material masking stringers attached to and parallel to each vertical longitudinal edge of each hard-material masking strip, each of said masking stringers having a width equal to less than half the distance between adjacent masking strips.

13. The process of claim 12, wherein the width of each hard-material masking strip with the attached pair of second-series masking stringers is substantially equal to $1\frac{1}{2}F$.

14. The process of claim 13, wherein each hard-material masking strip and attached pair of second-series masking stringers is separated from an adjacent hard-material masking strip and its associated stringers by a gap substantially equal to $\frac{1}{2}F$.

15. The process of claim 1, wherein said wordline layer is polysilicon.

16. The process of claim 15, which further comprises the step of self-aligned silicidation of the wordline stringers prior to the deposition of the separation layer.

17. The process of claim 1, wherein said first hard-material mask is created using the following process sequence:

(a) blanket deposition of an expendable layer on the upper surface of the silicon substrate;

(b) masking the expendable layer with a first array-patterning photomask, said first photomask consisting of a first series of substantially-parallel, substantially equidistantly-spaced photoresist strips applied at greater than half the maximum resolution of the photolithographic process;

(c) transfer of the first photomask pattern to the expendable layer, with a concomitant reduction of feature width and a corresponding augmentation of space width, such that strips formed from the expendable layer )hereinafter expendable material strips) are subjacent said first series of photoresist strips and narrower than each of said photoresist strips of said first series;

(d) blanket deposition of a first hard-material masking layer, said first hard-material masking layer coating the upper surface and vertical sidewalls of each expendable material strip, as well as exposed portions of the silicon substrate between each pair of expendable material strips;

(e) anisotropically etching the first hard-material masking layer to the extent that the upper surface of each expendable material strip is exposed and a hard-material masking stringer is created on each sidewall of each expendable material strip; and (f) etching away the expendable material strips to leave a first hard-material mask consisting of hard-material masking stringers having a pitch equal to half the pitch of the first array-patterning photomask.

18. The process of claim 17 wherein said transfer of the first array-patterning photomask pattern is effected by subjecting the expendable layer to an anisotropic etch having an isotropic component using said first series of photoresist strips as a mask, thus creating expendable material strips, each of which has a width substantially equal to half the width of a first-series photoresist strip, and also clearing the substrate between said expendable material strips.

19. The process of claim 17 wherein said expendable layer is silicon nitride and said first hard-material masking layer is silicon dioxide.

20. The process of claim 17 which further comprises the step of stripping the photoresist subsequent to step (c) and prior to step (d) of claim 17.

21. The process of claim 20 wherein said transfer of the first array-patterning photomask pattern is effected by the following steps:

(a) subjecting the photoresist strips of said first series to an oxygen plasma etch in order to substantially halve their width; and (b) anisotropically etching the expendable layer using the oxygen-plasma-etched first series of photoresist strips as a mask in order to create expendable material strips that are subjacent the plasma-etched photoresist strips, each of said expendable material strips having a pair of substantially vertical sidewalls and an upper surface that is substantially parallel to the upper surface of the silicon substrate.

* * * * *